United States Patent
Morton et al.

(10) Patent No.: US 7,471,570 B2
(45) Date of Patent: Dec. 30, 2008

(54) EMBEDDED EEPROM ARRAY TECHNIQUES FOR HIGHER DENSITY

(75) Inventors: Alec James Morton, Plano, TX (US); Jozef Czeslaw Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/230,078

(22) Filed: Sep. 19, 2005

(65) Prior Publication Data
US 2007/0064494 A1     Mar. 22, 2007

(51) Int. Cl.
G11C 11/34     (2006.01)
(52) U.S. Cl. ............... 365/185.28; 365/185.14
(58) Field of Classification Search ............ 365/185.28, 365/185.08, 185.29
See application file for complete search history.

(56) References Cited

U.S. PATENT DOCUMENTS

| | | | |
|---|---|---|---|
| 5,642,295 A | 6/1997 | Smayling | |
| 5,917,222 A | 6/1999 | Smayling et al. | |
| 6,157,058 A * | 12/2000 | Ogura | 257/315 |
| 6,272,584 B1 | 8/2001 | Stancil | |
| 6,487,139 B1 * | 11/2002 | Pathak | 365/230.06 |
| 6,574,140 B2 * | 6/2003 | Caywood | 365/185.06 |
| 6,862,223 B1 | 3/2005 | Lee et al. | |
| 2003/0127694 A1 | 7/2003 | Morton et al. | |
| 2003/0235080 A1 | 12/2003 | Yaegashi et al. | |
| 2004/0141374 A1 | 7/2004 | Park et al. | |
| 2005/0078521 A1 | 4/2005 | Chen et al. | |
| 2005/0088890 A1 | 4/2005 | Matsunaga et al. | |
| 2005/0104119 A1 | 5/2005 | Diorio et al. | |
| 2005/0117378 A1 * | 6/2005 | Cho et al. | 365/63 |
| 2005/0145922 A1 | 7/2005 | Farley et al. | |
| 2005/0169052 A1 * | 8/2005 | Hsu et al. | 365/185.03 |
| 2005/0248987 A1 * | 11/2005 | Shone | 365/185.28 |

OTHER PUBLICATIONS

U.S. Appl. No. 10/910,210, filed Aug. 2, 2004, Mitros et al.

* cited by examiner

*Primary Examiner*—Amir Zarabian
*Assistant Examiner*—Anthan T Tran
(74) *Attorney, Agent, or Firm*—Wade J. Brady, III; Frederick J. Telecky, Jr.

(57) ABSTRACT

An array structure of single-level poly NMOS EEPROM memory cells and method of operating the array is discussed implemented in a higher density embedded EEPROM layout that eliminates the use of high voltage transistors from the array core region. If they are utilized, the high voltage transistors are moved to row and column drivers in the periphery region to increase array density with little or no added process complexity to allow economic implementation of larger embedded SLP EEPROM arrays. During program or erase operations of the array, the method provides a programming voltage for the selected memory cells of the array, and a half-write (e.g., mid-level) voltage to the remaining unselected memory cells to avoid disturbing the unselected memory cells of the array.

43 Claims, 13 Drawing Sheets

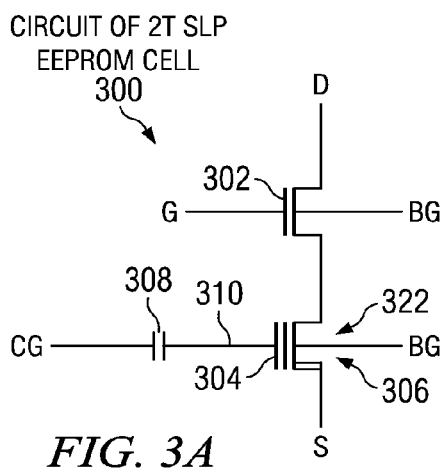
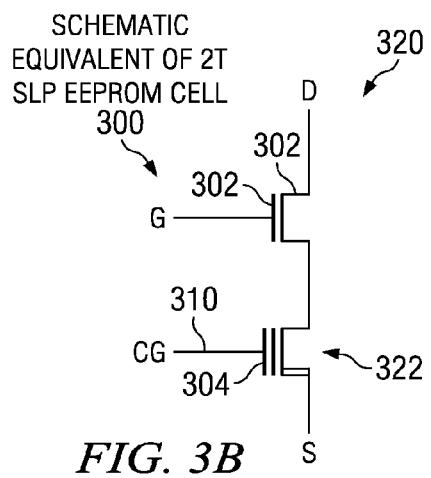
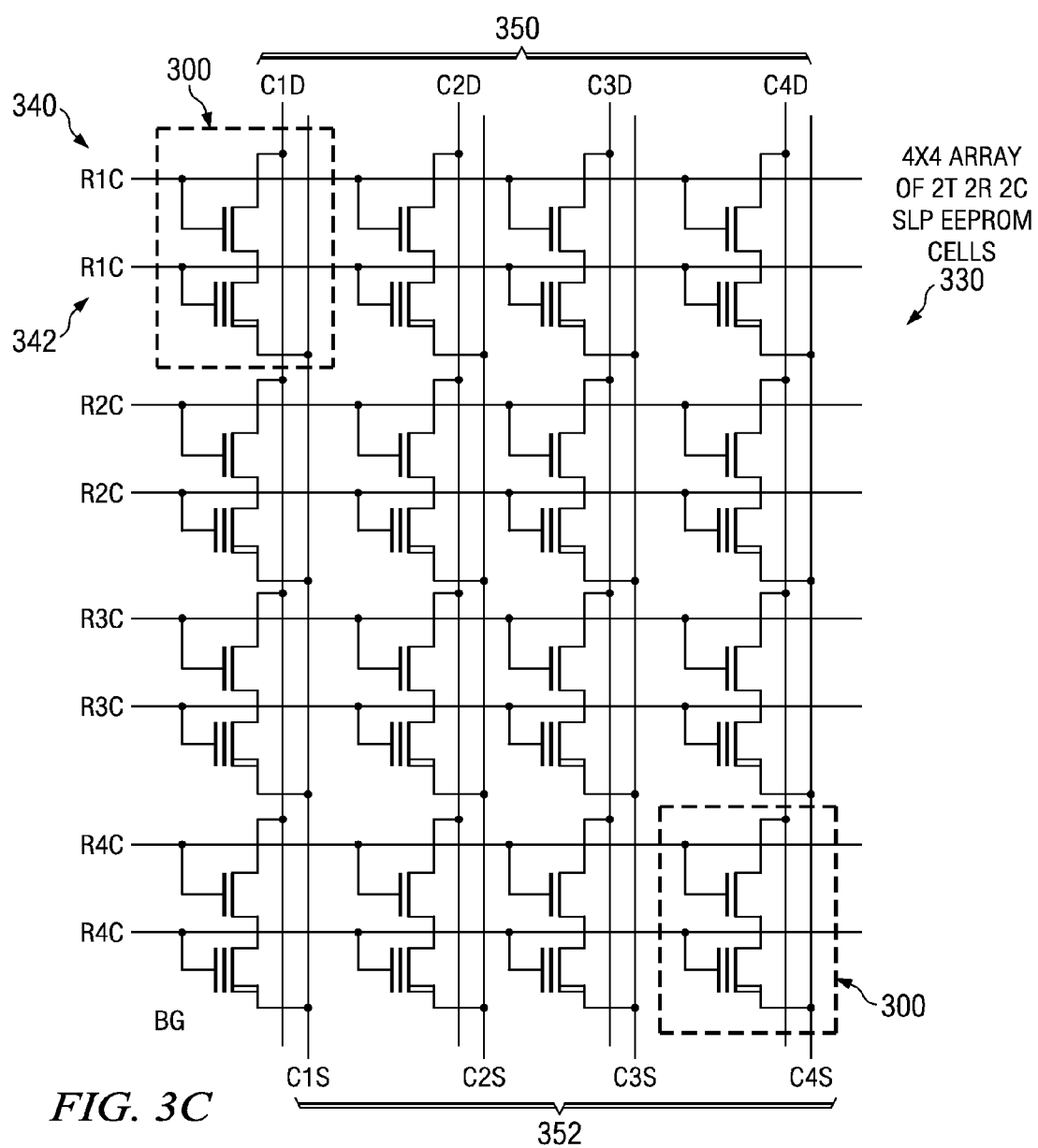

| | COLUMN ID | C1 | C2 | C3 | C4 |
|---|---|---|---|---|---|
| ROW ID | APPLIED VOLTS | 0V | 6V | 6V | 6V |
| R1 | 12V | 12V=PROG | 6V | 6V | 6V |
| R2 | 6V | 6V | 0V | 0V | 0V |
| R3 | 6V | 6V | 0V | 0V | 0V |
| R4 | 6V | 6V | 0V | 0V | 0V |

440

| COLUMN ID | | C1 | C2 | C3 | C4 |
|---|---|---|---|---|---|
| ROW ID | APPLIED VOLTS | 12V | 6V | 6V | 6V |
| R1 | 0V | -12V=ERASE | -6V | -6V | -6V |
| R2 | 6V | -6V | 0V | 0V | 0V |
| R3 | 6V | -6V | 0V | 0V | 0V |
| R4 | 6V | -6V | 0V | 0V | 0V |

| COLUMN ID | | C1 | C2 | C3 | C4 |
|---|---|---|---|---|---|
| ROW ID | APPLIED VOLTS | -6V | 0V | 0V | 0V |
| R1 | 6V | 12V=PROG | 6V | 6V | 6V |
| R2 | 0V | -6V | 0V | 0V | 0V |
| R3 | 0V | -6V | 0V | 0V | 0V |
| R4 | 0V | -6V | 0V | 0V | 0V |

| COLUMN ID | | C1 | C2 | C3 | C4 |
|---|---|---|---|---|---|
| ROW ID | APPLIED VOLTS | 6V | 0V | 0V | 0V |
| R1 | -6V | -12V=ERASE | -6V | -6V | -6V |
| R2 | 0V | -6V | 0V | 0V | 0V |
| R3 | 0V | -6V | 0V | 0V | 0V |
| R4 | 0V | -6V | 0V | 0V | 0V |

|  | COLUMN ID | C1 | C2 | C3 | C4 |
|---|---|---|---|---|---|
| ROW ID | APPLIED VOLTS | -12V | -6V | -6V | -6V |
| R1 | 0V | 12V=PROG | 6V | 6V | 6V |
| R2 | -6V | -6V | 0V | 0V | 0V |
| R3 | -6V | -6V | 0V | 0V | 0V |
| R4 | -6V | -6V | 0V | 0V | 0V |

480 ↘

|  | COLUMN ID | C1 | C2 | C3 | C4 |
|---|---|---|---|---|---|
| ROW ID | APPLIED VOLTS | 0V | -6V | -6V | -6V |
| R1 | -12V | -12V=ERASE | -6V | -6V | -6V |
| R2 | -6V | -6V | 0V | 0V | 0V |
| R3 | -6V | -6V | 0V | 0V | 0V |
| R4 | -6V | -6V | 0V | 0V | 0V |

600

| VOLTAGE LEVELS | PROGRAM OPERATIONS | | ERASE OPERATIONS | |
|---|---|---|---|---|
| | ROW DRIVER | COLUMN DRIVER | ROW DRIVER | COLUMN DRIVER |
| HIGHER LEVEL | 12V | 6V | 6V | 12V |
| LOWER LEVEL | 6V | 0V | 0V | 6V |

| ROW/COLUMN NAME | ROW/COLUMN SUBSET | BIAS/CONNECTION | ALTERNATE CONNECTIONS |
|---|---|---|---|
| R1G READ GATE SELECT ROW | ONE ADDRESSED/SELECTED ROW/WORD ONLY | VDD | VDD |
| RnG READ GATE SELECT ROW | ALL OTHER NON-SELECTED ROWS/WORDS | GND | GND |
| R1C COUPLING CAPACITOR ROW | ONE ADDRESSED/SELECTED ROW/WORD ONLY | READ BIAS | READ BIAS |
| RnC COUPLING CAPACITOR ROW | ALL OTHER NON-SELECTED ROWS/WORDS | GND | READ BIAS |
| CmS COLUMN SOURCE LINES | ALL COLUMN SOURCE LINES | GND | GND |
| C1D-C2D COLUMN DRAIN LINES | COLUMNS FOR SELECTED WORD | SENSE CIRCUIT | SENSE CIRCUIT |
| CmD COLUMN DRAIN LINES | ALL OTHER COLUMNS/NON-SELECTED WORDS | OPEN | SENSE CIRCUIT |

*FIG. 7*

EMBEDDED EEPROM ARRAY TECHNIQUES FOR HIGHER DENSITY

FIELD OF INVENTION

The present invention relates generally to nonvolatile memory (NVM) semiconductor devices and more particularly to single-level poly, floating-gate EEPROM array structures and a method of operating the EEPROM array, implemented in an array layout that eliminates the high voltage transistors from the core area to increase array density with little or no added process complexity, and drives the unselected memory cells of the array to a half-write voltage or less during program and erase operations to avoid disturbing the unselected memory cells of semiconductor devices.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices. Such memory devices are used for storage of data, program code, calibration, trimming and/or unit identification information in personal computer systems, embedded processor-based systems, credit and ID cards, video and communications devices and the like. Preferably, devices that include a memory will be configured such that if power is lost, the memory data will be retained. Such a memory device that retains data without power is called a non-volatile memory (NVM).

Semiconductor memories can, for example, be characterized as volatile random access memories (RAMs) or nonvolatile read only memories (ROMs), where RAMs can either be static (SRAM) or dynamic (DRAM) differing mainly in the manner by which they store a state of a bit. Examples of conventional NVM memory include electrically erasable, programmable read only memory (EEPROM), and Flash EEPROM or "commodity Flash" memory.

NVM memories range from very large arrays, such as commodity and embedded EEPROM arrays, and Flash EEPROM arrays (e.g., implementing thousands to many millions of bits), where the need for a smaller area may justify considerably greater process complexity, through the very small examples (e.g., implementing as few as single digits to thousands of bits) where keeping the added process complexity to a minimum justifies a larger area for each bit. Thus, the very large arrays generally utilize greater process complexity to obtain smaller cells, while smaller array applications may utilize less process complexity to save process costs while utilizing larger area cells.

For example, It is common to add as many a six photo mask operations and associated processing steps in an effort to achieve a high density of memory bits when embedding Flash memory to digital CMOS. Some of these process operations that are used to fabricate higher density EEPROM (e.g., stack etch, where multiple layers are etched or patterned using a single masking layer, or additional layers of poly-crystalline silicon and multiple thicknesses of gate or tunnel oxide) are operations that are not normally required to build designs without EEPROM. Thus, these process operations add cost and may require specialized equipment and skills.

Accordingly, single layer poly-silicon (SLP) EEPROM arrays may address the need for device applications at the lower end of the spectrum of process costs. SLP EEPROMs may be built with simpler silicon processes relative to the higher density Flash and EEPROM classes built with more complex silicon processes. For example, when a digital CMOS device is needed, an embedded SLP EEPROM memory may often be added with little or no added wafer cost to the CMOS device. However, process complexity and circuit techniques, not the number of poly layers, are the real differentiating properties between SLP EEPROM, for example, and Flash EEPROM.

In many SLP EEPROM implementations that minimize process complexity, several circuits may be replicated for each bit or memory location (e.g., level-shifters and sense amplifier or read latches). It is also common in these implementations to use four or more high voltage transistors per bit, which increases the area per bit to levels unacceptable for anything other than a NVM memory with a small number of bits.

The basic EEPROM storage element is called a floating gate transistor. One prior-art floating-gate transistor has a source S, a polysilicon floating gate FG storage node with no connection permitted, and a drain D. The gate is said to float without any direct electrical contact, embedded within a high-quality insulator. A charge placed on such a floating gate typically represents a data state or bit of data, and may be retained for a decade or more.

EEPROM memories using Fowler-Nordheim (F-N) tunneling are often programmed by applying a relatively high voltage level of from about 5 volts to about 30 volts across a tunneling region (e.g., a tunnel oxide or gate oxide) for a controlled period of time. Typical tunnel oxide thicknesses range from about 50 Angstroms to about 200 Angstroms. The silicon under at least part of the tunnel oxide area is doped sufficiently to avoid excessive depletion when programming voltages are applied. Electrons are placed on the floating gate storage node as charge flows through the gate oxide or tunnel oxide, reducing the electric field as the current falls towards zero. A reversed polarity results in reverse charge flow, providing the ability for a large but finite number of write/erase cycles.

EEPROM memory is typically arranged as a matrix of memory cells fabricated in an integrated circuit chip, and address decoding in the chip allows access to each cell for read/write functions. These Flash memory cells are often arranged in rows so that blocks of data such as words or bytes can be written or read simultaneously. Flash EPROM and EEPROM memory cells have many variations.

In a conventional memory array configuration, only a subset of the cells is typically addressed at one time. During write operations of several prior art memory arrays, for example, bias conditions must be such that the unaddressed cells in the accessed row or column are not subject to upset. Therefore, care is often taken during write operations to avoid reducing the stability of the data stored in unaddressed cells.

Accordingly, there is a need for an improved SLP EEPROM array structure and method of operating the EEPROM array in a manner that provides high density array structures with little or no added wafer cost, and/or without using high voltage transistors, while avoiding data upsets to the unselected memory cells during program and erase operations in NVM memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to an array structure of single-level poly EEPROM memory cells (e.g., NMOS memory cells) and method of operating the array. The EEPROM array is implemented in a higher density embedded EEPROM layout that eliminates the use of high voltage transistors from the array core region. If the high voltage transistors are utilized, they are moved to row and column drivers in the periphery region to increase array density in the core region with little or no added process complexity. This arrangement permits economic implementation of larger embedded SLP EEPROM arrays that have minimal process complexity. During program or erase operations of the array, the method provides a programming voltage comprising first and second half-write voltages associated with the row and column driver circuits, respectively, that are applied to the selected memory cells of the array, and one of the first and second half-write (e.g., mid-level, half-programming) voltages or less applied to the remaining unselected memory cells. Beneficially, this half-write method of operation further enables the operation of a lower voltage driver transistor, does not enable writing to the unselected memory cells, and avoids disturbing the unselected memory cells of the array.

In one implementation of the present invention, the array structure comprises an array of single-level polysilicon EEPROM memory cells arranged in a plurality of rows and columns, the array comprising row and column driver circuits operable to select one or more rows and columns of memory cells, respectively, to apply a programming voltage to the selected memory cells associated with the selected rows and columns, and to apply either a half-write voltage or no voltage to the remaining unselected memory cells of the array during a program or erase operation. The EEPROM memory cells comprises a MOS floating-gate transistor having a source/drain region connected to a column-source select line, for selecting and programming or erasing a first one of a column of selected memory cells; a gate capacitor or tunneling region; a coupling capacitor connected to a row control line for controlling program and erase operations of a first one of a row of selected memory cells; and a floating gate of the transistor coupled to the gate capacitor and the coupling capacitor at a common node therebetween. The floating gate is used for storing a charge representing a data state of the memory cell.

The half-write scheme of the present invention relies on the principle that the magnitude of the F-N tunneling current at the half-write voltage (e.g., about half the programming voltage) is small enough that non-selected bits are not written into or otherwise disturbed. The half-write scheme of the present invention is compatible with most existing SLP EEPROM schematic cell designs. The number of lead wires or interconnections per row and per column will vary depending on the cell design selected. The half-write scheme puts less voltage stress on some circuit nodes and allows the use of new smaller SLP EEPROM bits. The methods and structure described herein are applicable to silicon wafer fabrication and other such fabrication processes in the manufacture of semiconductor memory devices.

Although high density Flash EPROM and EEPROM arrays having no high voltage transistors in the core area of the array are not uncommon, the two-dimensional array of SLP EEPROM memory cells of the present invention having all high voltage transistors and level shift circuits removed from the array to the row and column driver circuits is innovative and new. In addition, this is particularly unexpected when implemented in a conventional digital CMOS process with no added wafer processing steps.

For example, the half-write method of the present invention enables the transistors of the core to be fabricated from low voltage devices (e.g., 3.3 volt transistors) that operate for a short period of time at nearly double that voltage (e.g., about 6 volts, a half-write voltage level). Then, by combining the half-write voltage applied to a row (e.g., about +6 volts), with another (complementary) half-write voltage applied to a column of cells (e.g., about −6 volts), a higher differential voltage (e.g., about 12 volts) is obtained across a selected cell, or group of cells, suitable to program or erase the selected memory cell(s).

A cell is programmed, for example, by applying one polarity voltage to the cell (e.g., about +12 volts), while the cell is erased by applying the opposite polarity programming voltage to the cell (e.g., about −12 volts). Similarly, the innovative method of the present invention further enables the row and column driver circuits to be fabricated using conventional lower voltage CMOS transistors in the level-shifter circuits, which traditionally use high voltage transistors. This is because these circuits now only need to withstand the half-write voltage levels (e.g., about 6 volts) for then only for a short period of time. Further, any number of cells of the array may be programmed or erased in this manner by selecting and applying programming voltage levels to any number of rows and columns associated with the selected cells, which will apply no more than about the half-write voltage or less (down to and including no voltage) to the unselected cells.

In another aspect of the invention, the MOS floating-gate transistor utilized in the EEPROM memory cells comprises either an nMOS or a pMOS device. The invention is compatible with most or all current, prior art SLP EEPROM cells.

In still another aspect, a first and second half-write voltage supply may also be used by row and column drivers of the SLP EEPROM array to provide first and second mid-level voltages (e.g., about 6 volts), which are each about half of the programming voltage (e.g., about 12 volts) to provide the full programming voltage to the selected memory cells and the half-write voltage (or zero voltage) level to the unselected memory cells. In this way, 0V, 6V, and 12V supplies, −6V, 0V, and +6V supplies, and −12V, −6V, and 0V supplies (for a cell programmed at about 12 V) may be used, depending on the interconnections of the two supplies and on which voltage levels are more convenient in a given application.

In yet another aspect of the invention, the memory cells are further operable to store multiple bits of data.

In another aspect of the invention, the gate capacitor comprises a gate dielectric layer of silicon dioxide preferably having a thickness of between about 60 angstroms and about 75 angstroms. However, a thickness of between about 50 angstroms and about 200 angstroms may also be utilized, depending on application and device requirements.

In still another aspect of the invention, the row and column driver circuits of the array comprise high voltage transistors, and the EEPROM memory cells of the array comprise only low voltage transistors having a single drain extension.

In yet another aspect of the invention, the floating gate of the MOS transistor forms one plate of the gate capacitor and the coupling capacitor shared in common.

In another aspect of the invention, the EEPROM memory cells of the array comprise first and second cross-coupled EEPROM bits.

In still another aspect of the invention, one of the row and column driver circuit blocks is isolated from the substrate to permit operation at a separate supply voltage. For example, a row driver circuit block may be insulated from the substrate operating at 0V, and raised to operate at the voltage level of the half-write voltage. In this way, the row driver may operate at 6V to provide 6V and 12V outputs, while the column driver operates at 0V to provide 0V and 6V outputs.

In yet another aspect of the invention, the array further comprises a MOS select transistor having a gate lead connected to a row select line for selecting a first one of a row of memory cells to read, a drain connected to a column-drain select line for selecting a first one of a column of memory cells associated with the column-drain select line to read, and a source lead connected to a drain of the MOS floating-gate (FG) transistor, wherein the MOS select transistor and the MOS floating-gate transistor are series connected between the column-drain select line and the column-source select line.

In another aspect of the invention, selected memory cells of the array are read by applying a read voltage to a selected row and columns of the array using the row and column drivers during a read operation.

In still another aspect of the invention, the EEPROM memory cell comprises one of a stacked capacitor SC EEPROM where the coupling capacitor may fully or partially overlap the FG transistor.

In still another aspect of the invention, the semiconductor process may use a dielectric isolated technology for SLP EEPROM where no junction in the array sees more than the half-write voltage, to further simplify structures and reduce the wafer area.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 3A and 3B are schematic diagrams of a 2T SLP EEPROM memory cell and the schematic equivalent of the cell, respectively, such as may be used in accordance with the present invention, FIG. 3A showing the coupling capacitor and floating gate transistor as two separate components while FIG. 3B more conveniently combines these two elements into a single element;

FIG. 3C is a schematic diagram of a 4×4 array of the 2T SLP EEPROM memory cells of FIGS. 3A and 3B, configured with 2 transistors, 2 row leads, and 2 column leads per cell used in accordance with one or more aspects of the present invention;

FIG. 4A is a schematic diagram of another 4×4 array of 1T SLP EEPROM memory cells, configured with 1 transistor, 1 row lead, and 1 column lead per cell used in accordance with one or more aspects of the present invention;

FIGS. 4B and 4C are charts of the exemplary conditions to program and erase, respectively, memory cell R1, C1 in the array of FIG. 4A, the voltages (0, 6, and 12 volts) applied to the rows and columns result in a differential programming voltage of 12 volts across the selected cell R1, C1, and result in a differential stabilizing voltage of 6 volts or less across the unselected cells of the array, wherein the maximum voltage between any two rows or columns is 6 volts, in accordance with several aspects of the half-write method of the present invention;

FIGS. 4D and 4E are charts of the exemplary conditions to program and erase, respectively, memory cell R1, C1 in the array of FIG. 4A, the voltages (−6, 0, and +6 volts) applied to the rows and columns result in a differential programming voltage of 12 volts across the selected cell R1, C1, and result in a differential stabilizing voltage of 6 volts or less across the unselected cells of the array, wherein the maximum voltage between any two rows or columns is 6 volts, in accordance with several aspects of the half-write method of the present invention;

FIG. 6 is a chart of exemplary voltage levels applied to half-write row and column driver blocks, such as those of FIG. 5C and FIG. 5D used in accordance with several aspects of the present invention;

FIG. 7 is a chart of exemplary read conditions for the 2 transistors, 2 row leads, and 2 column leads SLP EEPROM array of FIG. 3C, when reading row 1 and columns 1 and 2 in accordance with the half-write method of the present invention;

DETAILED DESCRIPTION OF THE INVENTION

Figure 1:
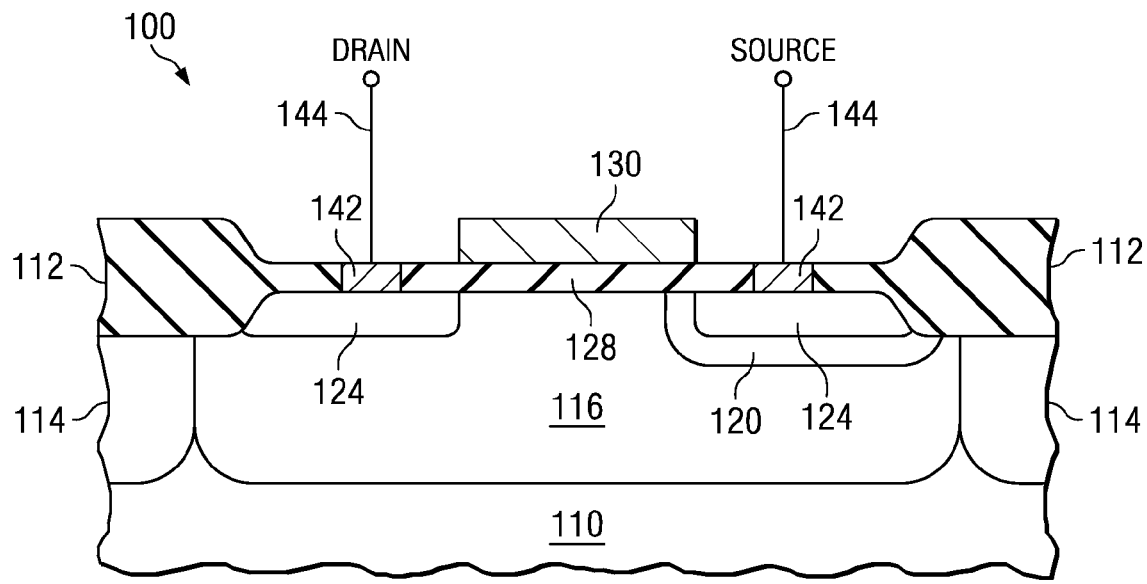
FIG. 1 is a simplified cross-sectional view of a of floating-gate MOS transistor having a drain extension region, such as may be used in an EEPROM memory cell in accordance with the present invention.

The present invention will now be described with reference to the attached drawings, wherein like reference numerals are used to refer to like elements throughout. The invention provides an improved embedded EEPROM array structure comprising single-level polysilicon (SLP) EEPROM memory cells (e.g., nMOS and pMOS cells) utilizing floating-gate storage technology. The array of EEPROM memory cells are programmed and erased using a novel half-write programming method. In the half-write programming scheme, row and column drivers of the array apply a full recommended programming voltage (VPP) across selected cells to be programmed or erased and also apply a half-write or mid-level voltage (e.g., half the programming voltage, VPP/2) or zero voltage to the remaining unselected cells of the array. The half-write voltage VPP/2 avoids disturbing the unselected cells and limits the voltage between any two rows or columns (or nodes) to the half-write voltage level. An unexpected result of this method, is that by limiting the voltage between any two nodes, the usual high voltage transistors required of the cascode level shifters needed to program the cells, may be eliminated.

Low process complexity SLP EEPROM memory cells are often embedded in various MOS devices, such as digital CMOS devices and other such MOS devices. The EEPROM memory cells, which are embedded within the MOS devices are often used to adjust or trim various circuit parameters of the host device, to store user information for ID cards, to store product or customer data within an RFID tag, or for general storage of data or code. These NVM EEPROM memories are ideal for this purpose, as they store such data indefinitely without power. Electrically programming and erasing an EEPROM device, however, requires a relatively high voltage (e.g., about 12 volts although this value will vary widely depending on the composition and thickness of the material used for F-N tunneling and on other process parameters) be applied across the memory cells. This high voltage is usually produced on-chip by a charge-pump circuit or another such device if suitable voltages are not already available.

VPP is the recommended programming voltage for the EEPROM cell, typically determined by characterization of the cell and by consideration of all the expected tolerances in manufacturing the cell. VPP should be selected high enough to ensure satisfactory programming in a reasonable time, and low enough to avoid damage to the cell and low enough that VPP/2 (half the recommended programming voltage) will not disturb other cells in the array.

The same value of VPP is usually suitable also for the recommended erasing voltage for the EEPROM cell, although in a few cases a slightly different value may be preferred.

The recommended voltage level and tolerances in that level for VPP can vary widely. Both process details and geometric layout variations affect VPP. Generally, VPP increases with a thicker F-N tunneling dielectric (to give a peak electric field of about 8E6 V/cm in silicon dioxide). Also, VPP increases as the coupling ratio becomes smaller. The coupling ratio is the value of the coupling capacitor divided by the gate or tunneling capacitor plus stray capacitances. Smaller coupling ratios result in a smaller fraction of the applied voltage VPP appearing across the F-N tunneling dielectric.

Values for VPP may vary from about 8 V to about 24 V or beyond. For convenience in the text that follows, VPP is assumed to be about 12 V, which is a possible representative value for a SLP EEPROM cell design using a 3.3 V CMOS silicon process and a relatively high coupling ratio. For other cell designs, even on the same test die and built with the same process, the value for VPP can be different, with a SC EEPROM cell requiring a value of about 18 V.

Because this high programming voltage is utilized, however, the transistors used in the level shifter circuits, and/or in the EEPROM cell, and/or in the charge-pump circuit, must usually be designed to withstand this relatively high programming voltage. When such transistors of EEPROM circuits must withstand these high programming voltages, the oxide insulators and junction areas required of these transistors also tend to grow thicker and larger. Adding to the high voltage problem, traditional SLP EEPROMs often duplicate the level shifter circuit and a precharge read latch for every memory cell to make cell access simpler, and because previous cell quantities were relatively low, the relative area penalty was justifiable.

However, as current trends continue to push for greater cell quantities to provide more on-chip data storage and higher EEPROM memory densities to provide smaller and lower cost devices, the space required of each EEPROM cell becomes more of a premium. These trends are becoming particularly evident in device applications utilizing or limited to the low process complexity SLP EEPROM designs, and those that have numerous duplications of the level shifter and precharge read latch circuits.

Accordingly, the present invention provides a solution to the low density of existing SLP EEPROM memories by arranging the storage cells into rows and columns of cells at a core portion of an array, and by moving the high voltage requirements of transistors to the periphery of the array. The present invention moves these transistors away from the core portion of the array, and the area requirements for each cell drop dramatically.

However, because each cell must still be able to withstand the full high programming voltage VPP, some implementations of the invention use a single drain extension region to protect the storage transistor from VPP. In particular, the transistor of the storage cell needs to be protected from or to withstand VPP from one (or optionally both) source/drain regions to the bulk node.

Further, such transistors will be referred to herein, as High Breakdown Voltage Source-to-Bulk HBVsb transistors with source (and/or drain) to bulk p-n junction breakdown voltages above VPP. Typically, these transistors may be available in a CMOS process by reusing a well implant (of the opposite polarity) as the drain (and/or source) extension region. Lateral physical separation of the poly gate and regular S/D source/drain implants is not required because the transistor does not need to operate as a transistor with voltages above VPP/2. Source (and/or drain) to bulk voltage ratings exceed VPP but gate to source and gate to drain voltage ratings are similar to conventional CMOS transistors. These devices are useful in an SLP EEPROM array, and the normal self-aligned poly to S/D structure may be required to provide for effective F-N tunneling. These devices are smaller than DECMOS transistors and while not fully self-aligned they require less additional area to allow for mask alignment and image size variations.

The drain extension solution has several advantages. The drain extension is simple and cost effective to implement, and only adds a modest area increase, which may also be effectively utilized in the present invention by the coupling capacitor and gate capacitor which will be discussed below.

Drain Extended DE CMOS or DECMOS transistors are transistors with drain (and/or source) extensions to increase the Vgd and Vds (and/or Vgs and Vsd) ratings above VPP. Typically, these transistors may be available in a CMOS process by reusing a well implant or implants (of the opposite polarity) for the drain (and/or source) extension region. Lateral physical separation of the poly gate and regular S/D implants is required to allow the drain extension to function and the depletion region under the gate to extend back into the drain extension region.

Note that either the drain or the source of the floating-gate MOS transistor discussed herein may utilize the drain extension to obtain the required HBVsb. By contrast, if a standard "high voltage" HV transistor is used in the core portion of the array, a much thicker gate oxide that is too thick for useful F-N tunneling is typically used requiring a larger chip area. HV transistors have Vgs, Vgd and Vds voltage ratings above VPP. HV transistors are typically not available in CMOS process without adding process steps to fabricate the thicker gate oxide and without re-engineering the S/D structures to increase the p-n junction breakdown voltage.

Alternately, a stacked capacitor SC configuration may also be used to help reduce the required p-n junction voltage ratings in the EEPROM array and is anticipated in the context of the present invention. Typically, this requires a somewhat more complex process. However, a parallel plate capacitor suitable for use as stacked capacitor was a standard component in one silicon process used to demonstrate this invention.

In a representative implementation of this invention using a true SLP EEPROM array with junction isolation, VPP is applied between an n-type well forming one plate of the coupling capacitor and the n-type S/D implants of the floating gate transistor. Both junctions (from the n-well and the S/D) to the p-type substrate or bulk node must withstand the voltage VPP. In another representative implementation of this invention using an SC EEPROM array with junction isolation, VPP is applied between the isolated top plate of the coupling capacitor and the n-type S/D implants of the floating gate transistor. With this second structure, it is possible to design so that no junction in the array needs to withstand the voltage VPP.

In addition, this invention comprehends that such voltage requirement reductions in the transistors of the memory cells may be facilitated by splitting the programming voltage VPP into two portions or halves. Specifically, VPP is split into a first mid-level voltage (VPP/2), which is applied to the row(s) and another second mid-level voltage (VPP/2), which is applied to the column(s) associated with the selected cell(s) to be programmed or erased. For example, a first mid-level voltage (e.g., 0-6V, VPP/2) of the full 12V programming voltage may be applied to a row associated with a selected cell via a row driver, and a second mid-level voltage (e.g., 6-12V, VPP/2) of the full 12V programming voltage may be applied to a column associated with the selected cell via a column driver.

By contrast, most designs using F-N tunneling apply the full voltage stress only to the bits to be written and do not utilize the knowledge that at half the recommended field strength for writing data, the tunneling current is negligible (half-write scheme). Other designs leave some nodes floating during write operations. However, this invention applies this realization in the half-write method to provide well defined voltages to all row and column lines during write operations to insure data stability.

In this way, this invention realizes that each cell, as well as the row and column drivers only needs to withstand VPP/2 (e.g., 6V). Thus, as an unexpected benefit of the half-write method, the need of the higher voltage and larger area HV transistors, and/or the DECMOS transistors, may be significantly reduced in both the core portion and the periphery portion of the array (e.g., from VPP to VPP/2). Instead, the simpler HBVsb transistors may be substituted.

In one aspect of the present invention, to implement this beneficial reduction (e.g., from VPP to VPP/2) in the row and column drivers, both the row and column driver circuit blocks may be isolated from the substrate (e.g., in an isolated n-well or p-well) to permit operation at a separate supply voltage. For example, a row driver circuit may be insulated from the substrate operating at 0V, in order to raise the row driver to operate at the half-write voltage VPP/2. In this way, the row driver circuit may be raised to operate at 6V in order to provide higher level 6V and 12V outputs, while the column driver circuit operates at 0V to provide lower level 0V and 6V outputs. The additive combination of these two voltage inputs creates a differential voltage of VPP across the selected memory cell(s), thereby programming or erasing the cell, depending upon the applied voltage polarity to the associated row(s) and column(s). Note that both the row and column driver circuits are isolated from the substrate, because program and erase operations will alternately require the row and column drivers to be raised to VPP/2, to produce the opposite polarity voltage differential across a cell.

Thus, as a result of these inventive solutions, the EEPROM memory of the present invention may be dramatically reduced in size and cost particularly for medium array sizes.

As only one or two charge-pumps are needed per EEPROM memory array to produce the high programming/erase voltages, added space for the charge pump(s) is of little concern, particularly when charge pumps may be easily designed using transistors that only need to withstand the voltage between each pump stage (e.g., a lower 3.3V read voltage level). Existing art includes many ways to implement charge pumps suitable for use with this invention (for those cases where charge pumps are needed). Transistors rated at the source or input voltage level are sufficient to produce VPP although these transistors, associated capacitors and interconnect must be able to be isolated from the substrate up to the full VPP voltage. Care in design is necessary to make sure that switching transients or other design defects do not produce transitory voltages greater than the desired values. Control of the rise time of the voltages from any charge pumps may be used to reduce the peak F-N tunneling currents and improve the reliability and/or durability of the EEPROM array.

The array structure and half-write methodology provides a minimal array area for a modestly sized array in an embedded SLP EEPROM memory array, by moving the high voltage transistor requirements from the array core area to the periphery row and column drivers, and by applying the innovative half-write scheme, lower voltage requirements of the transistors in the core and periphery are facilitated while program and erase operations are enabled. In addition, by applying a mid-level voltage VPP/2 of the half-write method to the unselected cells of the array, data upsets are avoided in the unselected cells. Most SLP EEPROM implementations with no added process steps consist of a level shifter that converts a logic level signal representing the data to be stored to the higher voltage level required for programming, an EEPROM element or element pair, and sense or read circuit. By contrast, this invention shows how to reduce the number of added components and how to eliminate high voltage transistors from the EEPROM array, moving them (and the level shift function) to the row driver and column driver peripheral circuits.

The system and method of the present invention is applicable to MOS devices and floating-gate storage technologies, but is also applicable to other such cells and technologies and these are anticipated in the context of the invention.

Exemplary implementations are hereinafter illustrated and described in the context of fabricating single-level polysilicon EEPROM cells, arrays, and methods to improve the storage density, particularly in highly scaled and low process complexity memory arrays having little or no added wafer processing costs, for example, to add an SLP EEPROM array to a digital CMOS device, and to avoid write data upsets, wherein the structures illustrated are not necessarily drawn to scale.

Although an SLP EEPROM array structure and several cells are discussed and illustrated in the context of the present invention, other such memory arrays and cells may also utilize the methods and circuits illustrated herein, and these arrays and cells are contemplated. Further, it will be appreciated that the invention may be employed in the fabrication of nearly any CMOS processes or MOS memory devices, deep sub-micron digital technologies, mixed signal, analog and power technologies, silicon wafer fabrication, and other such NVM fabrication processes in the manufacture of semiconductor memory devices and other such processes apart from the exemplary memory structures described and illustrated herein. These and other benefits will become more apparent as the following figures are described below.

Beginning at FIG. 1 a floating-gate MOS transistor 100 is illustrated comprising a drain extension region 120, such as may be used in an EEPROM memory cell in accordance with the present invention. MOS transistor 100 is formed within a p-substrate 110 that may be a lightly doped p-type silicon wafer, or a p-type epitaxial layer on a more heavily doped p-type starting wafer. A mask divides the wafer into field oxide LOCOS/FOX regions 112 and active regions, which includes the rest of the wafer excluding the LOCOS/FOX regions 112. The FOX regions 112 are formed by selectively protecting the active areas with silicon nitride, growing thermal oxide to form the FOX regions. MOS transistor 100 further comprises a p-type well PWELL 116 that is formed by masked implants and that may be adjacent to n-type wells NWELL 114. P-well properties are selected to be suitable for fabricating n-channel MOSFET devices, and the NWELL 114 and PWELL 116 are deeper than the LOCOS/FOX regions 112. N-type wells NWELL 114 are also formed by masked implants.

A drain extension region 120 comprising a lightly doped source and/or drain region, extends beyond the usual heavily doped source/drain S/D implant regions NSD 124, and is engineered to allow some of the gate to source or gate to drain voltage to appear across depleted silicon and increase the Vgd and Vds or Vgs and Vsd voltage ratings of the device 100. Transistor 100 is an HBVsb device, and uses the drain extension 120 to increase the source to bulk breakdown voltage, but not the gate-to-source voltage rating and is smaller than a similar DENMOS device. After all field oxidation 112, well implants and annealing, a gate oxide 128 is then thermally grown over the entire active area. A polysilicon gate 130 is then formed by depositing polysilicon, which may be selectively doped, and is then patterned to form a transistor gate electrode 130.

After a sidewall spacer adjacent to the edges of gate 130 is formed (not shown), additional implants and anneal operations are used to form the S/D regions NSD 124, including any lightly doped drain NLDD regions, and heavy or regular drain regions. The S/D regions 124 are silicided, additional insulating material such as silicon oxide or nitride (not shown) is grown or deposited, covering FOX 112, S/D 124 and gate 130 and may be planarized by Chemical Mechanic Polish CMP. Openings are then etched down to the silicide and conductive contacts 142 are formed within the openings in the additional insulating material. Source and drain terminals 144 are then attached to the contacts 142 for electrical connection to the device 100. When transistor 100 is used as a floating gate transistor, no contact is made to the floating gate 130. Connections to substrate 110 and PWELL 114 forming the bulk or back gate contact are not shown.

Figure 2A:
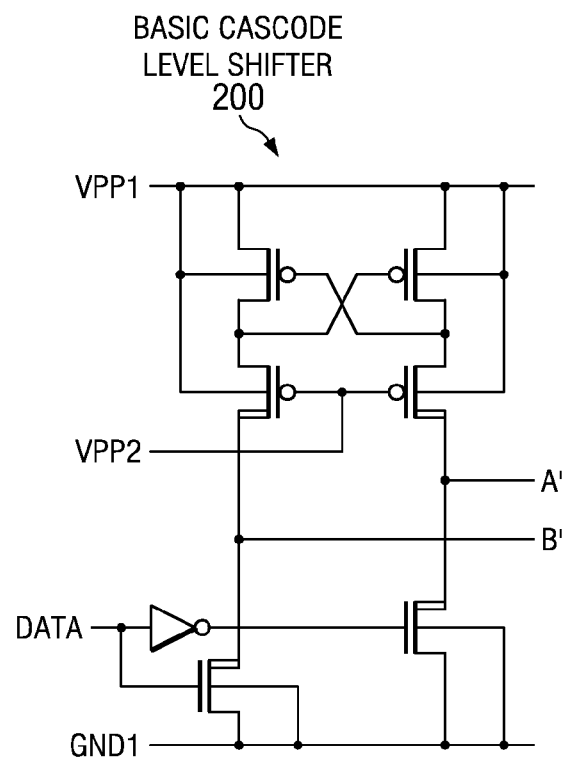
FIG. 2A is a schematic diagram of a basic cascode level shifter circuit used to supply complimentary (true and inverse) raised voltage levels in the form of a differential programming bias to an EEPROM memory cell such as may be used in accordance with the present invention.

FIG. 2A illustrates a basic cascode level shifter circuit 200 used to supply one of two raised programming voltage levels (VPP1 or VPP2) in the form of a differential programming bias to an EEPROM memory cell such as may be used in accordance with the present invention. When DATA is input to the level shifter circuit 200, comprising four high voltage (e.g., 12V) or drain extended transistors (the lower two NMOS and PMOS transistors), the DATA and its' complement DATA-bar are amplified and translated from logic level signals (e.g., for address decode, data manipulation) to two programming voltage levels (e.g., 0 V and VPP or 12 V). This level shifter may readily be modified to produce other voltage levels for use with the current invention (e.g., a lower 0V and 6V level, or a higher 6V and 12V level). These programming voltages (VPP1 or VPP2) are applied (at A' and B') to an EEPROM memory cell to program the cell in one direction or to erase the cell when applied in the opposite direction.

Figure 2B:
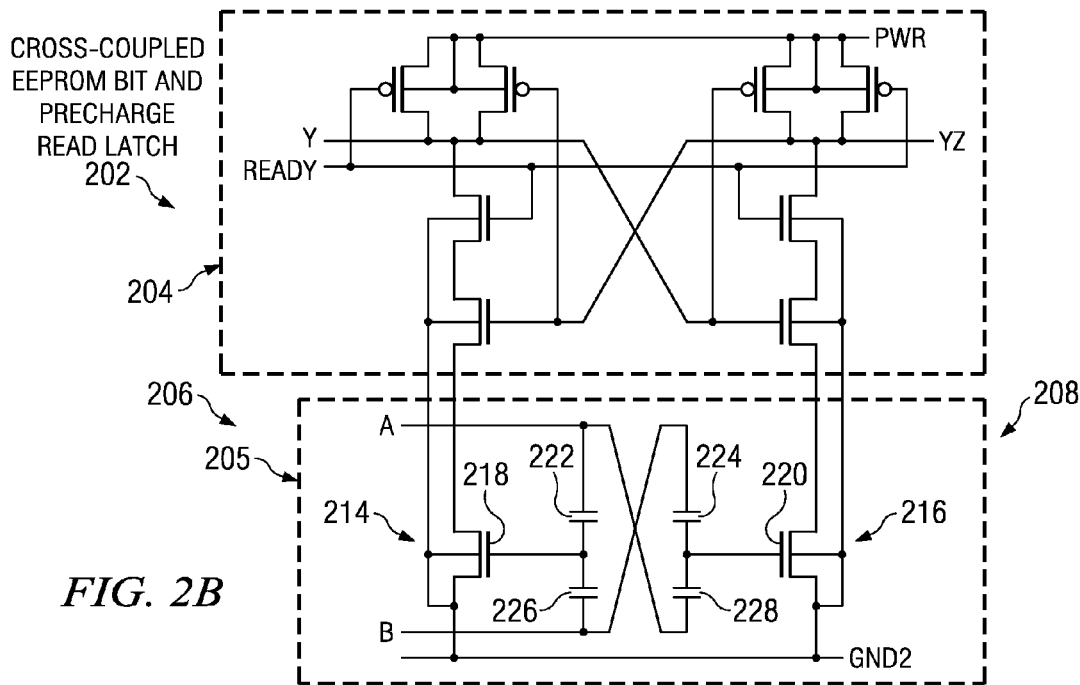
FIG. 2B is a schematic diagram of a cross-coupled EEPROM bit and precharge read latch circuit, the precharge read latch used to read a data state from the EEPROM memory cell such as may be used in accordance with the present invention.

FIG. 2B illustrates one example of a cross-coupled EEPROM cell and precharge read latch circuit 202 that may be used in accordance with the present invention. The precharge read latch 204 is used to read a data state from the EEPROM memory cell 205 such as may be used in the present invention. The cross-coupled or dual EEPROM memory cell 205 comprises a first bit 206 and a second bit 208, wherein the bits are cross-coupled. The first and second bits, 206 and 208, respectively, have a floating-gate transistor 214 and 216, a large coupling capacitor 222 and 224, and a small tunneling capacitor 226 and 228, respectively. The gate of each floating-gate transistor 214 and 216 is connected to a storage node 218 and 220, a large capacitor 222 and 224, and a small tunneling capacitor (tunneling region) 226 and 228, respectively. Input coupling node A of the cell 205 cross-couples between the large capacitor 222 of the first bit 206 and the small capacitor 228 of the second bit 208, while input coupling node B of the cell 205 cross-couples between the large capacitor 224 of the second bit 208 and the small capacitor 226 of the first bit 206.

By cross-coupling the two bits in this manner, the first bit 206 attains the opposite or complimentary state of the second bit 208, because the states stored on storage nodes 218 and 220 are read and reinforced via floating gate 214 and 216, respectively, when amplified and latched by READ latch 204.

During a READ memory cycle, and upon receipt of a READ signal input, the data state sensed on each floating-gate transistor 214/216 is read by READ latch 204 at complementary READ latch outputs Y and YZ.

Figure 2C:
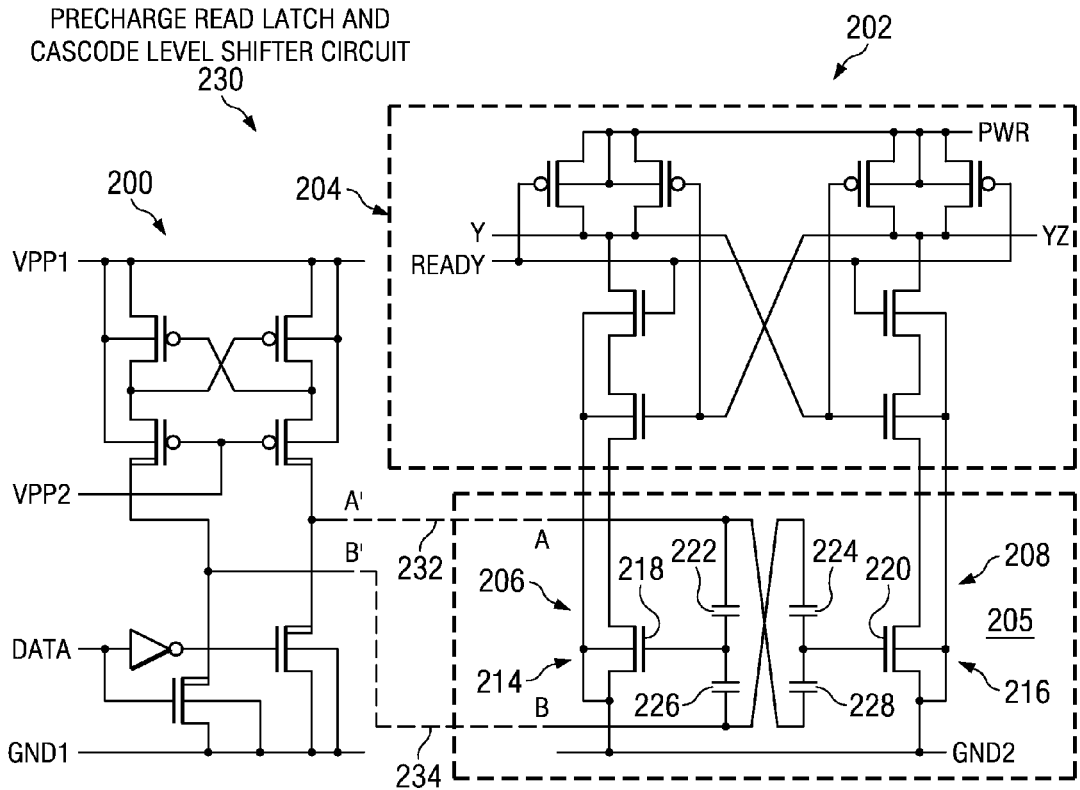
FIG. 2C is a schematic diagram of the basic cascode level shifter circuit of FIG. 2A connected to the cross-coupled EEPROM bit and precharge read latch circuit of FIG. 2B, suitable for programming a data state into the EEPROM memory cell such as may be used in accordance with the present invention.

FIG. 2C illustrates a simplified one bit SLP EEPROM memory circuit 230 comprising the basic cascode level shifter circuit 200 of FIG. 2A interconnected to the cross-coupled EEPROM cell and precharge read latch circuit 202 of FIG. 2B, suitable for programming, erasing, and reading the data state of the EEPROM memory cell 205 such as may be used in accordance with the present invention. Complementary outputs A' and B' of the basic cascode level shifter circuit 200 are connected to the input coupling nodes A and B of cross-coupled EEPROM cell 205 via interconnects 232 and 234, respectively. In a practical layout, parts of some components may be merged to reduce die area. For example, capacitors 222 and 228 may share one NWELL and capacitors 224 and 226 may share another NWELL.

GND1 may be at the same potential as GND2, or at another potential if desired, for example to control the bias conditions during read operations. Potential differences between GND1 and GND2 may be supported either by relying on standard CMOS isolation techniques (which can modify the threshold voltage on some NMOS transistors due to body effect) or by the use of a DNWELL plate and NWELL ring to isolate a complete CMOS circuit block from substrate.

For example, with 12V on input coupling node A, and ground 0V on B, tunneling occurs in tunneling region 226 and 228. If GND1 and GND2 are at the same potential, tunneling occurs in tunneling region 226 and 228 and some tunnel current may also flow in transistor 214 between the floating gate and source. Small changes in potential difference between GND1 and GND2 will affect the locations where tunneling occurs.

One or two dozen such SLP EEPROM memory circuits 230, are sometimes used to store a corresponding small volume of memory data in, for example, a digital CMOS device as embedded EEPROM memory for trimming various parameters of the MOS device, or retaining product ID information, for example, in an RFID tag. Such memory is particularly advantageous where low cost simple processes are desirable, and where little or no added wafer cost is needed. As indicated previously, however, such memory having HV transistors, requires a large area per bit (e.g., 700 µm²/bit).

Alternately, however, if the EEPROM cells 205 are arranged in rows and columns of an array, wherein one or more level shifters 200 are used on the rows and columns, and a precharge read latch 204 is used to read and latch the data in each row, considerable wafer area per bit may be saved in accordance with the present invention. Further, a simplified EEPROM cell is also made possible with this scheme, without the use of HV transistors or DECMOS transistors in the core area of such an array by using an innovative half-write method of programming and erasing the cells.

The implementations of FIGS. 2A-2C generally work well, but such cells or arrays of cells occupy a large area. Attempts to reduce die area using a two-dimensional array and moving the level shifters to row and column drivers, and sharing read circuits between bits in a column have been successful, but these methods suffer from the disadvantage that some HV components have to be repeated for each cell; otherwise, the process complexity must be increased. For example, adding a thicker gate oxide and implants capable of handling VPP safely, increases process complexity.

For example, FIGS. 3A and 3B illustrate an exemplary 2T SLP EEPROM memory cell 300 and a schematic equivalent 320 of the cell 300, respectively, such as may be used in accordance with the present invention. Cell 300 comprises an nMOS read select transistor 302 for row READ selection, in series with a drain extended nMOS transistor 304 having a drain extension DE region 306, a coupling capacitor 308, and a floating-gate 310 for storage of a charge representative of a data state. Cell 300 comprises a drain terminal D at the drain of the nMOS read select transistor 302 having a row select gate lead G and a back gate node BG for biasing the substrate region of select transistor 302. Cell 300 further comprises a row control gate lead C connected to the coupling capacitor 308, a source lead S at the drain extension DE region 306, and a back gate node BG for biasing the substrate region of the drain extended nMOS transistor 304.

FIG. 3B illustrates the schematic equivalent 320 of the 2T SLP EEPROM memory cell 300 comprising the nMOS read select transistor 302 for row READ selection and an SLP EEPROM storage element 322 for storage of a charge representative of a data state. Cell 300 also comprises a drain terminal D, a row select gate lead G, a row control gate lead C, a source lead S, and a back gate BG node (not shown, except at the array level) for biasing the substrate region of the cell.

Cell 300 utilizes the floating-gate storage technology, where data is retained as charge stored on an isolated node with no contacts or direct connections, and this node also forms the gate terminal of a MOSFET (Metal Oxide-Semiconductor Field Effect. Transistor). Writing data (both program and erase) method is by F-N (Fowler-Nordheim) tunneling (charges tunnel through a thin insulator only under the influence of a strong electric field). Programming (but not erasing) is also possible with hot carrier injection. One floating gate node can store: one binary bit of data (the simplest case with a single threshold to differentiate between a data 1 and a data 0), or multiple bits of data. Multi-bit storage, however, requires more careful control of the parametric conditions for write operations to store different amounts of charge to represent different data values and for read operations to recover the data correctly; for example four different amounts of charge separated by three threshold levels may be used to represent two binary bits of data or four data values. An analog signal (a continuously variable signal) can be represented by storing a continuously variable amount of charge, which is achieved by careful control of programming time and/or voltage.

FIG. 3C illustrates a preferred implementation of an exemplary 4x4 array 330 of the 2T SLP EEPROM memory cells 300 of FIGS. 3A and 3B, configured with 2 transistors, 2 row leads, and 2 column leads per cell 300 used in accordance with one or more aspects of the present invention. Array 330 comprises 16 exemplary SLP EEPROM cells 300, arranged in four rows and columns, comprising four row select lines RxG 340 for selecting a row of gate leads G during READ memory operations, and four row control lines RxC 342 for program or erase control of a row of control gate leads during program or erase memory operations. Array 330 further comprises four column drain select lines CyD 350 for selecting a column for reading back data during a READ operation, and four column source select lines CyS 352 for selecting a column and control of the cells in the column during program or erase memory operations.

In this way, the control gate CG and tunneling region T (or CG and S for Merged Tunneling Region MTR implementations) terminals of the EEPROM bit cells are connected to row and column lines respectively, forming a two-dimension 2D array. Each node or row/column intersection in the array represents one EEPROM bit location.

In this improved implementation of the present invention, one level shifter 200, having four 12V DE CMOS transistors per row and per column (e.g., provided by a row and column driver) may be utilized to program and erase the cells. Further, one precharge read latch 204 or other sense circuit per column may be utilized to read back the data. Neither high voltage transistors, nor level shift circuits are located inside the SLP EEPROM array. All high voltage transistors and level shift circuits are located instead in the row and column driver circuits.

In another related solution or implementation, each SLP EEPROM bit uses about +6V and −6V, for example, to provide the needed about 12V across a cell for programming and erasing the cells (the half-write method), thereby eliminating DE CMOS transistors altogether. This solution, brings the area required per bit to about 7 $\mu m^2$/bit, permitting a larger and more cost effective SLP EEPROM memory for embedded memory applications having little or no added wafer costs. This implementation of the present invention provides a very low current solution, with no added wafer cost in an easy circuit design having low overhead while utilizing a familiar (digital CMOS) technology.

In this more efficient array configuration it is possible to program or erase at one time to: one or more cells 300, one or more rows of cells, one or more columns of cells, an entire block or all the cells of the array 330. More typically, a single word (usually several or all the bits in one row) may be selected for programming or erasing operations.

One bit may be programmed by taking one row positive and one column negative creating a differential voltage equal to the desired programming voltage for the EEPROM cell, while leaving all other row and column lines at the mid-point of the positive and negative voltages. One bit may be erased by taking one row negative and one column positive creating a differential voltage equal to the desired programming voltage for the EEPROM cell, while leaving all other row and column lines at the mid-point of the positive and negative voltages.

Multiple bits (identified by selecting any number of rows and any number of columns up to the entire array) may be programmed (or erased) at one time by taking multiple rows and/or columns high and low (or low and high) respectively.

All bits to be written experience the full write or program voltage (12 V). Bits not to be written see half the write voltage (6 V, half write scheme) or zero voltage. Due to the very steep dependence of F-N tunneling currents on electric field and applied voltage, this provides plenty of margin between writing to the desired bits and disturbing (reducing the charge stored) bits not being written at this time, even allowing for the effects of voltage due data written (charge stored on the FG) previously.

Although a 2T cell configuration and a 2T 2R 2C array is illustrated and described in the context of the present invention, it is also understood that numerous other 1T, 2T, 4T cell configurations and array configurations are possible.

The following partial list of possible array configurations is provided to illustrate areas where this invention may be applied: Many more combinations are also anticipated in the context of the present invention.

1T 1R 1C SF 1 transistor (the FG device) per cell; 1 row lead CG; 1 column lead S (with common drain connection), source follower SF sense scheme.

1T 1R 1C CS 1 transistor per cell; 1 row lead CG; 1 column lead D (with common source connection), conventional sense scheme CS at a shared collector node.

1T 1R 2C 1 transistor per cell; 1 row lead CG; 2 column leads, S for writing and D for sensing.

1T 1R 3C STR 1 transistor per cell; 1 row lead CG; , 3 column leads, TR for writing and S and D for sensing, with separate tunneling region STR.

1T 1R 2C STR 1 transistor per cell; 1 row lead CG; 2 column leads, TR connected to S for writing, and D for sensing, with separate tunneling region.

2T 2R 2C 2 transistors (FG and conventional select transistors); 2 row leads CG and G; 2 column leads, S for writing and D for sensing (this is the style we characterized).

2T 1R 3C STR XC 2 FG transistors per cross-coupled cell with 2 separate tunneling regions and 2 coupling capacitors; 1 row lead CG/TR; 3 column leads, 1 for TR/CG for writing and 2 for differential sensing.

4T 2R 3C STR XC 4 transistors (FG and conventional select transistors per cross-coupled cell with 2 separate tunneling regions and 2 coupling capacitors); 2 row leads CG and G; 3 column leads, 1 for TR/CG for writing and 2 for differential sensing.

Figures 4A, 4B:
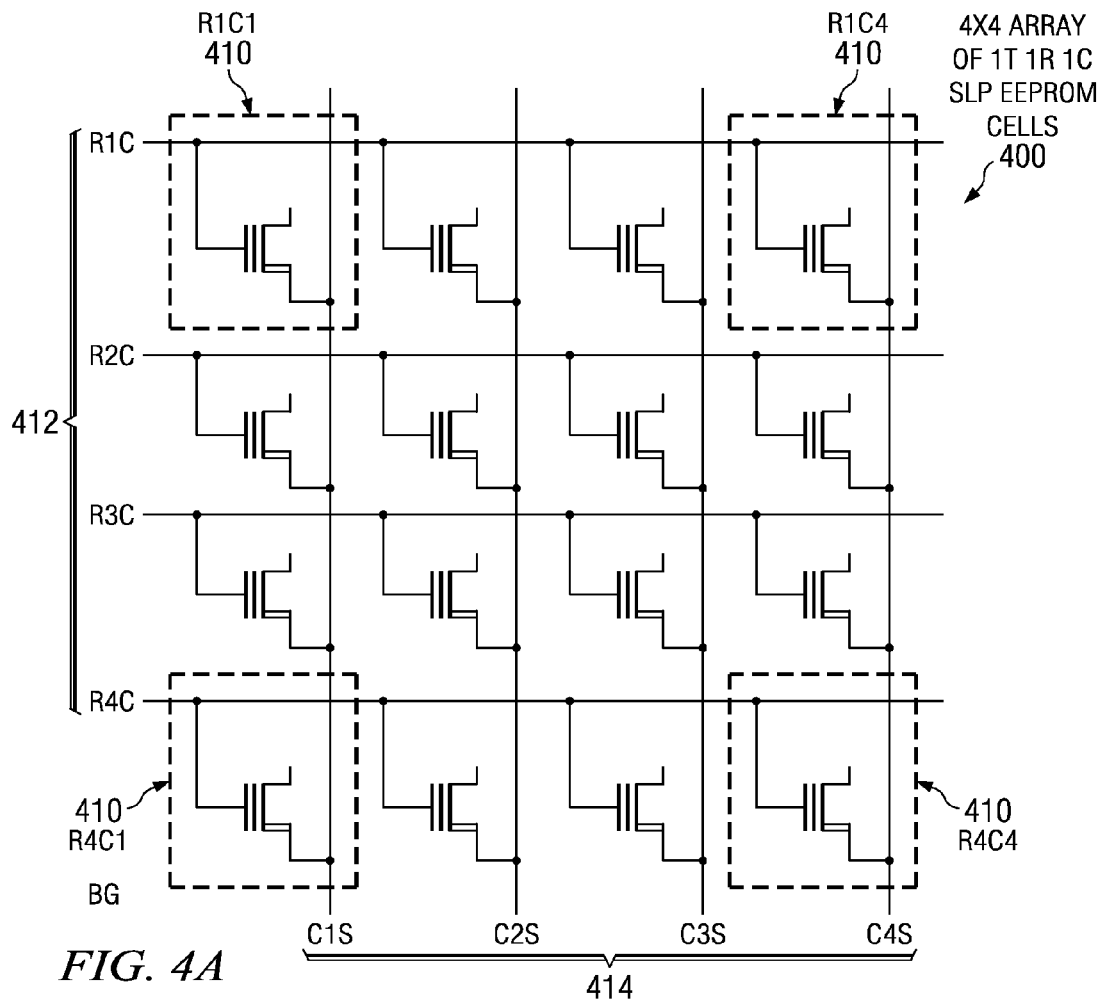

For example, FIG. 4A illustrates another preferred implementation of an exemplary 4×4 array 400 of 1T SLP EEPROM memory cells 410, configured with 1 transistor, 1 row lead, and 1 column lead per cell used in accordance with one or more aspects of the present invention. Array 400 again comprises 16 exemplary SLP EEPROM cells 410, arranged in four rows and columns, comprising four row control lines 412 RxC for program or erase control of a row of control gate leads during program or erase memory operations. Array 400 further comprises four column source select lines 414 CyS for selecting a column and control of the cells in the column during program or erase memory operations. Several examples of cell 410 are illustrated at array positions R1C1, R1C4, R4C1, and R4C4.

In these examples, the control gates, C, connect to the row lines RxC 412 and the tunneling regions T (or merged tunneling and source regions S) connect to the column lines CyS 414. +12 V from C to T/S programs a cell while −12 V from C to T/S erases a cell and +−6 V or less does not affect a cell. A full-write voltage=12 V and half-write voltage=6 V for the purposes of this example. Note that more than one bit (typically, the bits in one word, but it could be the entire array) can be programmed or erased at one time.

The 4×4 array 400 of FIG. 4A, shows the connections required to write into a cell. The symbol shows a cell with the T and S terminals merged, and having a 1T 1R 1C configuration. If all BG terminals connect to substrate and all drains D connect to another node, you can both write and read the array. However, a 1T 1 R 2C configuration (with all D terminals in one column connecting to the second column lead CyD) is easier to read with little or no area penalty. Note that the 2T 2R 2C configuration of FIG. 3C provides a safer read configuration having a select transistor (e.g., 302). To read the 1T 1R 1C source follower array 400, at least two dummy columns CPS and CES may need to be added (making a 4 row, 6 column array in this example). In addition, all bits in column CP are programmed and all bits in column CE are erased.

FIGS. 4B and 4C illustrate charts of the exemplary conditions to PROGRAM 430 and to erase 440, respectively, memory cell R1, C1 (410) in the array 400 of FIG. 4A, in accordance with several aspects of the half-write method of the present invention. FIGS. 4B and 4C further illustrate the voltages (0V, 6V, and 12 volts) that are applied to the rows and columns and the resulting differential programming voltage of 12 volts that is developed across the selected cell R1, C1, and the resulting differential stabilizing voltage of 6 volts or less developed across the unselected cells of the array, wherein a maximum voltage between any two rows or columns is 6 volts.

Such half-write voltages may be provided to the cells of the array as selected by row and column driver circuits. These tables apply equally to a full write voltage (e.g., 12V, VPP) and to the half-write voltage (e.g., 6V, VPP/2) row and column driver circuits, as will be illustrated and described in association with FIGS. 5B-5D below.

For example, half-write PROGRAM conditions chart 430, shows that either about 6V or 12V is applied to rows 1-4, while about 0V or 6V is applied to columns 1-4. In the exemplary selected cell R1, C1 (410) of FIG. 4B, a differential voltage of about 12V is produced across the cell 410, thereby programming the cell 410. Note that all other rows have 6V applied (the half-write voltage), which is insufficient to program all the other cells of the array when 6V is applied to the remaining columns. In this way, a differential voltage of either 6V or 0V is provided across all the remaining (unselected) cells of the array 400, thereby stabilizing the unselected cells of the array 400 from data upsets.

Similarly, half-write erase conditions chart 440, shows that either about 0V or 6V is applied to rows 1-4, while about 6V or 12V is applied to columns 1-4. The erase conditions provide the opposite polarity voltage differential to the cells than are provided by the PROGRAM conditions. In the exemplary selected cell R1, C1 (410) of FIG. 4C, a differential voltage of about −12V is produced across the cell 410, thereby erasing the cell 410. Note that all other rows have 6V applied (the half-write voltage), which is insufficient to program all the other cells of the array when 6V is applied to the remaining columns. In this way, a differential voltage of either 6V or 0V is provided across all the remaining (unselected) cells of the array 400, thereby stabilizing the unselected cells of the array 400 from data upsets.

In addition to these all-positive voltage levels of 0 V, 6 V and 12 V, negative levels of −12 V, −6 V and 0 V or balanced levels of −6 V, 0 V and 6 V also work equally with this scheme. The absolute voltage applied to the row and column data in the two tables change but the differential voltages as seen by the cells does not change. In a typical application, all the bits in a given word that are to be written to a "0" are first erased, and then all the bits in a given word that are to be written to a "1" are programmed.

In one or more preferred implementations, the negative voltage mentioned above is the ground, reference or substrate voltage (0V), the positive voltage is the write or programming voltage (12 V) and the non-selected row and column line mid-point voltage is the half write voltage (6 V). This is the all-positive supply case.

In some implementations the negative voltage mentioned above is a negative half write voltage (−6 V), the mid-point voltage is the ground, reference or substrate voltage (0V), and positive voltage is the half write voltage (6 V). This is the balanced (part positive, part negative) supply case.

During write operations, the maximum voltage difference between any two row lines applying voltage to the SLP EEPROM array is the half write voltage (6 V). During write operations, the maximum voltage difference between any two column lines applying voltage to the SLP EEPROM array is the half write voltage (6 V). For either scheme, it is preferable to generate two half write voltage supplies (rather than one half write supply and one full write supply), one for the row driver circuits and the other for the column driver circuits, to help ensure that no EEPROM bit sees more voltage than intended regardless of the details of the power up and power down sequencing. This eliminates some possible data disturb problems.

FIGS. 4D and 4E, for example, illustrate charts of the exemplary conditions to PROGRAM 450 and to erase 460, respectively, memory cell R1, C1 (410) in the array 400 of FIG. 4A, in accordance with several aspects of the half-write method of the present invention. FIGS. 4D and 4E further illustrate the voltages (−6, 0, and +6 volts) that are applied to the rows and columns and the resulting differential programming voltage of 12 volts that is developed across the selected cell R1, C1, and the resulting differential stabilizing voltage of 6 volts or less developed across the unselected cells of the array, wherein a maximum voltage between any two rows or columns is 6 volts.

For example, half-write PROGRAM conditions chart 450, shows that either about 0V or 6V is applied to rows 1-4, while about 0V or −6V is applied to columns 1-4. In the exemplary selected cell R1, C1 (410) of FIG. 4D, a differential voltage of about 12V is produced across the cell 410, thereby programming the cell 410. Note that all other rows have 0V applied, which is insufficient to program all the other cells of the array when 0V is also applied to the remaining columns. In this way, a differential voltage of either 6V or 0V is provided across all the remaining (unselected) cells of the array 400, thereby stabilizing the unselected cells of the array 400 from data upsets.

Similarly, half-write erase conditions chart 460, shows that either about 0V or −6V is applied to rows 1-4, while about 0V or +6V is applied to columns 1-4. The erase conditions provide the opposite polarity voltage differential to the cells than are provided by the PROGRAM conditions. In the exemplary selected cell R1, C1 (410) of FIG. 4E, a differential voltage of about −12V is produced across the cell 410, thereby erasing the cell 410. Note that all other rows have 0V applied, which is insufficient to program all the other cells of the array when 0V is also applied to the remaining columns. In this way, a differential voltage of either 6V or 0V is provided across all the remaining (unselected) cells of the array 400, thereby stabilizing the unselected cells of the array 400 from data upsets.

Figures 4F, 4G, 5A:
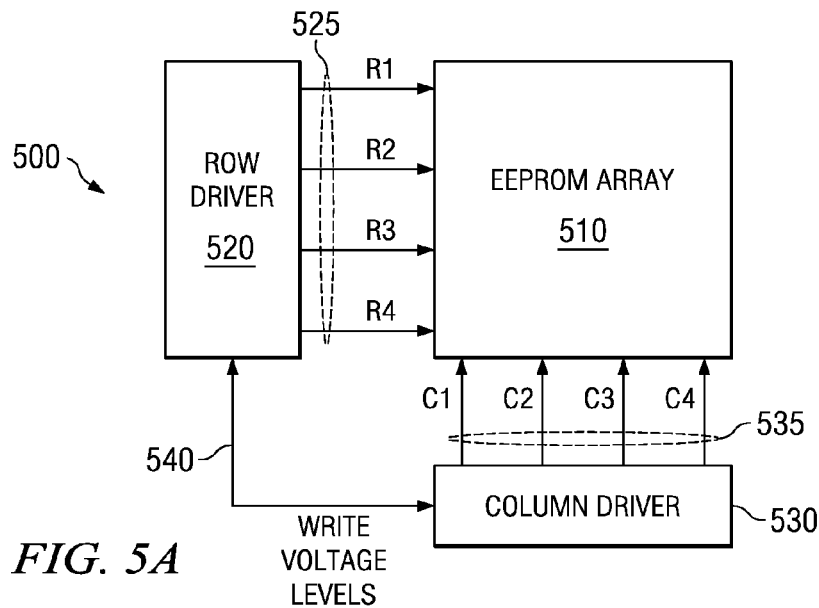
FIGS. 4F and 4G are charts of the exemplary conditions to program and erase, respectively, memory cell R1, C1 in the array of FIG. 4A, the voltages (−12, −6, and 0 volts) applied to the rows and columns result in a differential programming voltage of 12 volts across the selected cell R1, C1, and result in a differential stabilizing voltage of 6 volts or less across the unselected cells of the array, wherein the maximum voltage between any two rows or columns is 6 volts, in accordance with several aspects of the half-write method of the present invention.
FIG. 5A is a simplified block diagram of an exemplary array of SLP EEPROM memory cells similar to that of FIGS. 3C and 4A, having row and column drivers operable to program and erase the array of cells with the programming and half-write voltage levels utilized in accordance with the half-write method of the present invention.

FIGS. 4F and 4G, illustrate charts of the exemplary conditions to PROGRAM 470 and to erase 480, respectively, memory cell R1, C1 (410) in the array 400 of FIG. 4A, in accordance with several aspects of the half-write method of the present invention. FIGS. 4F and 4G further illustrate the voltages (−12, −6, and 0 volts) that are applied to the rows and columns and the resulting differential programming voltage of 12 volts that is developed across the selected cell R1, C1, and the resulting differential stabilizing voltage of 6 volts or less developed across the unselected cells of the array, wherein a maximum voltage between any two rows or columns is 6 volts.

For example, half-write PROGRAM conditions chart 470, shows that either about 0V or −6V is applied to rows 1-4, while about −12V or −6V is applied to columns 1-4. In the exemplary selected cell R1, C1 (410) of FIG. 4F, a differential voltage of about 12V is produced across the cell 410, thereby programming the cell 410. Note that all other rows have −6V applied (a half-write voltage), which is insufficient to program all the other cells of the array when −6V is also applied to the remaining columns. In this way, a differential voltage of either 6V or 0V is provided across all the remaining (unselected) cells of the array 400, thereby stabilizing the unselected cells of the array 400 from data upsets.

Similarly, half-write erase conditions chart 480, shows that either about −6V or −12V is applied to rows 1-4, while about 0V or −6V is applied to columns 1-4. The erase conditions provide the opposite polarity voltage differential to the cells than are provided by the PROGRAM conditions. In the exemplary selected cell R1, C1 (410) of FIG. 4G, a differential voltage of about −12V is produced across the cell 410, thereby erasing the cell 410. Note that all other rows have −6V applied (a half-write voltage), which is insufficient to program all the other cells of the array when −6V is also applied to the remaining columns. In this way, a differential voltage of either 6V or 1V is provided across all the remaining (unselected) cells of the array 400, thereby stabilizing the unselected cells of the array 400 from data upsets.

FIG. 5A illustrates an exemplary simplified SLP EEPROM array 500 similar to the arrays of FIGS. 3C and 4A, such as may be used in accordance with the half-write method of the present invention. The array 500 comprises an array of SLP EEPROM memory cells 510 arranged in rows and columns of cells (e.g., cells 300, 410, 205), a row driver 520 operable to drive a plurality of rows 525 of cells, and a column driver 530 operable to drive a plurality of columns 535 of cells, to one of a plurality of program/erase voltages levels 540.

The row and column drivers 520 and 530, respectively, are operable to program and erase the cells of the array 500 using the program/erase voltages levels 540, for example, similar to those utilized in FIGS. 4B-4G in accordance with the half-write method of the present invention. Program/Erase voltage levels 540 are applied to row Rx and column lines Cy under the control of logic level signals not shown. In addition, the row and column driver circuits are operable to provide one of two (or more) half-write voltage levels to the respective rows and columns of cells. The combination of the row half-write voltage and the column half-write voltage provides the selected cell with a full program/erase voltage level.

Row and column driver circuits 520 and 530 are required to perform level shifting (convert logic level signals to the full voltage swing required to write data). There are several well understood ways to do this (including but not limited to the schemes described herein) with single stage DECMOS, cascode CMOS operating up to half-write voltage levels, and multi-transistor circuits further reducing the voltage levels experienced by individual transistors.

In some classes of implementation of row and column driver circuits (full write voltage driver circuits), drain extended CMOS DECMOS or high voltage CMOS HVC-MOS transistors are used to generate the required voltage swings (up to 12 V). Drain extended transistors can operate with the full write voltage (12 V) on the drain although the gate to source voltage is restricted to the nominal transistor operating voltage (e.g., 3.3 V). One of many possible row or column driver circuit configurations selects one of three MOSFET analog switches to connect the driven row or column line to one of the three voltage levels (0, 6 or 12 V).

In other classes of implementation of row and column driver circuits (half write voltage driver circuits), conventional CMOS transistors (typically self-aligned, poly-gate MOSFET transistors, possibly with some dimensions enlarged to handle the half write voltage; they are smaller than DECMOS and HVCMOS) are used to generate the required voltage swings within the entire set of row driver circuits and within the entire set of column drivers (up to 6 V within either set).

This will place the half write voltage (6 V) across gate oxide and from drain to source, but in many cases including most typical CMOS logic processes, the half write voltage (6 V) is safe for cumulative duration of the maximum allowed number of program/erase cycles (each of which is subject to the maximum recommended program pulse width), although it may not be safe for continuous operation. In other words, the full program voltage (12 V) is generated by the sum of the voltages from the row and column driver circuits, each of which operates at the half write voltage (6 V). This class of half-write voltage row and column driver circuits can be simpler and smaller than full-write voltage driver circuits. The output that can be a simple binary or two value (high and low) circuit, usually implemented in CMOS.

Typical implementations use low level digital logic for address decode, data manipulation and any other necessary functions, followed by a level shifter (typically a cascode configuration with about 8 conventional or DE CMOS transistors) to convert the logic level signal to programming levels (0 to 6 V or 6 to 12 V depending on the program or erase function being performed). The two sets of voltage swing (0 V to 6 V or 6 V to 12 V) can be generated by the same circuit block just be applying the correct power supply voltage levels.

Low-level logic (e.g., running from about 1.0 to 1.8 V in typical deep sub-micron CMOS processes and taking advantage of the smallest or "core" logic transistors available in such processes, or slightly higher voltages in older or mixed signal processes) may be significantly smaller and lower cost than logic circuits able to operate at higher voltages.

Even when the row and column driver circuits use HVC-MOS or DECMOS transistors, the half write voltage driver architecture may be advantageous.

Figure 5B:
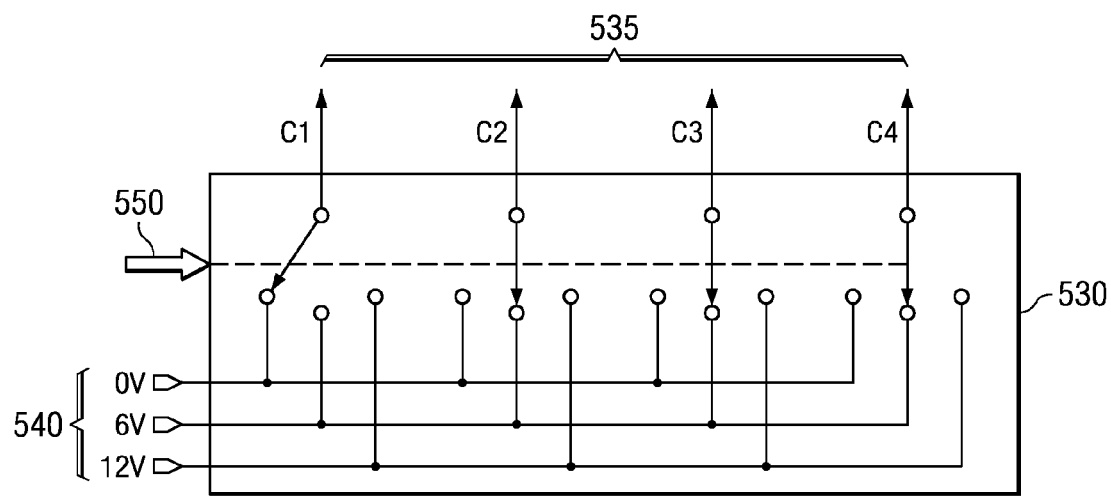
FIG. 5B is a simplified schematic representation of an exemplary column driver operable to select and apply one of three programming and half-write voltages to the columns of cells of the array of FIG. 5A, during program or erase operations in accordance with the half-write method of the present invention.

FIG. 5B illustrates a simplified representation of an exemplary column driver 530 operable to select and apply one of three programming or half-write voltages to the columns of cells of the array 500 of FIG. 5A, during program or erase operations in accordance with the half-write method of the present invention.

For the full write row/column driver schemes, three voltage levels are applied to each driver block and each output can be connected to one of three levels. As shown in FIG. 5B, the switches of the column driver 530 are set to program cell R1C1 or column C1. A full write row driver 520 would look and operate similar to that of FIG. 5B. Column driver 530 further comprises the Program/Erase voltage levels 540, and column select logic lines 550, which select the programming or erase voltage that is applied to the plurality of column lines 535. Column driver 530 of FIG. 5B may use HV CMOS or DE CMOS devices, as higher voltage levels are needed in this style driver.

For the all-positive supply case with full write voltage circuits, no special transistor isolation is required (conventional CMOS processing may be used). N-channel transistors are built in a p-type well (typically at substrate potential) and p-channel transistors are built in an n-type well (typically biased up to the most positive supply voltage).

Figure 5C:
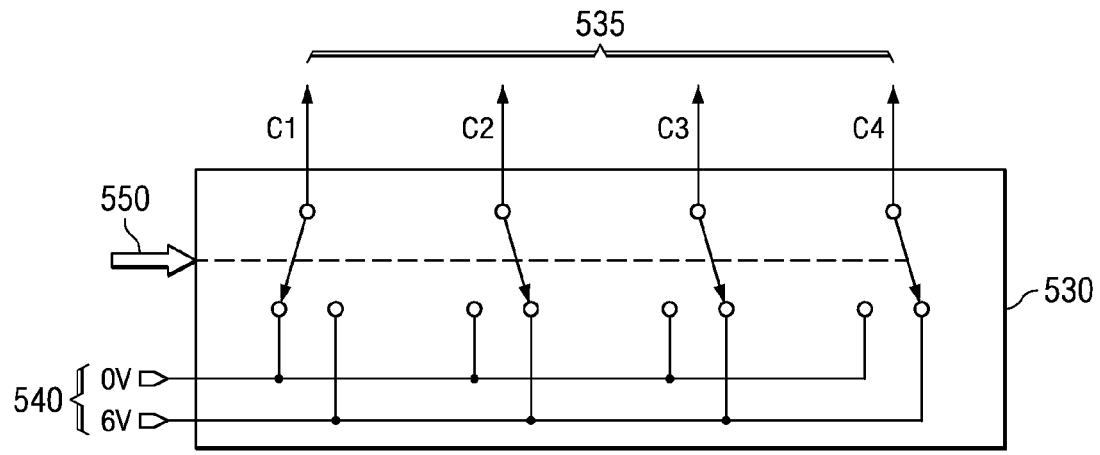
FIGS. 5C and 5D are simplified schematic representations of exemplary column and row drivers, respectively, operable to select and apply one of two programming and half-write voltages to the columns and rows of cells of the array of FIG. 5A, during program or erase operations in accordance with the half-write method of the present invention.
Figure 5D:
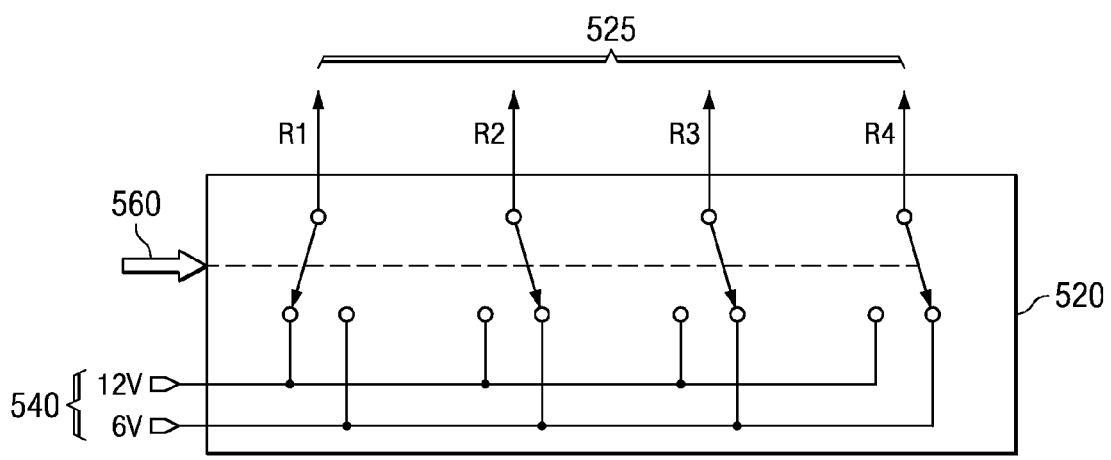

FIGS. 5C and 5D illustrates other simplified representations of an exemplary column driver 530 and row driver 520, respectively, operable to select and apply one of two programming and half-write voltages to the columns and rows of cells of the array 500 of FIG. 5A, during program or erase operations in accordance with the half-write method of the present invention.

For the half-write row/column driver scheme, two voltage levels are applied to each driver block and each output can be connected to one of two levels. As shown in FIG. 5C, the switches of the column driver 530 are set to program cell R1C1 or column C1. As shown in FIG. 5D, the switches of the row driver 520 are set to program cell R1 C1 or row R1. Column driver 530 further comprises the Program/Erase voltage levels 540, and column select logic lines 550, which select the programming or erase voltage that is applied to the plurality of column lines 535. Row driver 520 further comprises the Program/Erase voltage levels 540, and row select logic lines 560, which select the programming or erase voltage that is applied to the plurality of row lines 525.

The above described half-write scheme reduces the voltage seen by any one transistor to 6V maximum for Vgs, Vgd and Vds, and reduces the number of transistors required in any one block. By floating the whole driver block at (e.g., 6V) above ground when needed, and in accordance with one implementation of the invention, 12V can be applied to row or column lines. Because of this half-write method, column driver 530 and row driver 520 do not need to use HV CMOS or DE CMOS devices, as only the lower half-write voltage levels are needed in this style driver. Voltage levels and switch positions vary between program and erase operations.

FIG. 6 illustrates a chart 600 of exemplary voltage levels applied to half-write row and column driver blocks (520 and 530) used in accordance with several aspects of the present invention.

Chart 600 of FIG. 6 shows the two voltage levels (in addition to logic level power VDD and GND) applied to half-write row and column driver blocks (520 and 530) for program and erase operations. The row and column driver blocks (520 and 530) are equivalent to four single pole double-throw switches. Each driver/level shifter circuit (e.g., 520 and 200, or 530 and 200) can convert a logic level signal (e.g., for address decode, data manipulation, etc.) to a programming level (VPP1, VPP2) signal. For example, the logic level signals may be converted to a 0 V and 6 V lower level signal, or to a 6 V and 12 V higher level signal, depending on the programming voltage levels (VPP1, VPP2) applied to that circuit block, as described in association with the level shifter circuit 200 of FIG. 2A. The logic level signals 550, 560 may first be set up, and then the programming voltage levels (VPP1, VPP2) may be applied for the duration of the program/erase time. This sequencing avoids through current power dissipation problems and the need to size any transistor above a minimum size to allow switching with power applied.

Note: When the lower voltage level is 6 V, that entire driver block (e.g., 520, 530) may be floated 6 V above ground, for example, using a deep n-well (DNWELL or Buried N layer) used to isolate the driver circuit from the substrate, as will be discussed further in association with FIGS. 8 and 9. For the balanced supply case (−6V, 0V, +6V) (this is necessary for implementations with voltages below ground), and for some implementations of the half write voltage circuits (to reduce the peak voltages from transistor source/drain regions to bulk), the set of row driver circuits and the set of column driver circuits are isolated from substrate. The area cost of this isolation is small (only two independent isolation regions are needed). Many, but not all CMOS processes offer the necessary DNWELL process step either as a standard or as an optional process feature.

The circuits and conditions above can be used to program and erase almost any SLP EEPROM bit configuration, including the 2T 2R 2C array 330 of FIG. 3C. Voltages on the RxG and CyD lines are not critical, and ground for RxG and a floating condition for CyD are suitable choices.

FIG. 7 illustrates a chart 700 of exemplary read conditions for the 2T 2R 2C SLP EEPROM array of FIG. 3C, when reading row 1 and columns 1 and 2 in accordance with the half-write method of the present invention.

To read the 2T 2R 2C array 330 of FIG. 3C and applying the read conditions of chart 700, all rows (RxG and RxC) and columns CyS are grounded, except row RxG that is to be read is at VDD, and row RxC for the row that is to be read is at a "read forward bias" level. Depending on the sense scheme that is used to read from the CyD columns, the optimum bias is slightly greater than the threshold of a virgin cell (a cell that has never been programmed) and a variety of methods are available to generate this bias automatically, compensating for process and temperature variations. Alternatively, GND can be used for the "read forward bias" level on RxC, but the read access time and apparent data retention lifetime may be slightly degraded.

Note: If the word length equals the row length, all CyD lines may be connected to sense circuits during READ operations.

FIGS. 8A-8D illustrates an exemplary floating-gate shallow trench isolated (STI) SLP EEPROM memory cell 800 such as may be used in accordance with several aspects of the present invention. The SLP EEPROM memory cell 800 is similar to the storage element 322 of FIG. 3B, comprising a DE nMOS floating-gate transistor 801*a* (304) having a drain extension region 810/810*a* (306), a larger coupling capacitor 801*b* (308), and a polysilicon floating gate 828 (310). Polysilicon floating gate 828 (310) is used as one plate of the coupling capacitor 801*b* (308) and as one plate of a smaller tunneling capacitor (226, 228) as an inherent part of transistor 801*a* formed by the gate 828 to source (810*a*, 812*a*, 816*a*, 820, 852) overlap and the gate oxide 824.

FIGS. 8A-8D illustrate a typical implementation of a SLP EEPROM bit in a representative CMOS process using p-n junction isolation, Shallow Trench Isolation STI for field oxidation, implants, Single Level Poly-silicon SLP, and advanced planarization with Chemical Mechanical Polishing CMP. In many deep sub-micron CMOS processes, the process steps required to fabricate the SLP EEPROM are a subset of the full process. The simplified process description that follows and the device descriptions are intended to help the reader understand the devices and processes used in the prior art and in association with the present invention. Many process steps necessary for successful manufacture but not critical to an understanding of the basic principles are omitted.

It may be helpful to consider the SLP EEPROM cell or element as a six terminal device with terminals:

Source S,

Floating gate FG (the isolated storage node with no connection permitted),

Drain D,

Control gate CG,

Tunnel region T (may be a separate terminal or inherently part of an S or a D terminal), Bulk node or back gate BG.

It may also be helpful to think of the basic SLP EEPROM storage element (e.g., 322) as consisting of three circuit elements:

N-channel transistor (used to read back data),

Coupling capacitor (couples most of the voltage change applied at the control gate onto the floating gate), Tunneling region T (the location of F-N tunneling with adequate doping of any silicon to prevent excessive depletion; may be a separate capacitor/tunnel element, a dedicated tunneling region within the transistor channel or an inherent part of the transistor such as gate to source overlap).

When there is a separate tunneling region and terminal T, this is called a separate tunneling region STR. When the tunneling region is built into the transistor, this is called a merged tunneling region MTR; there is no terminal T and terminal S (or D) is used for writing instead of T.

Process Flow for FIGS. 8 A-8D:

As an nMOS device, SLP EEPROM memory cell 800 is fabricated starting with a p-type silicon wafer. The wafer may be a lightly doped p-type or it may have a p-type epitaxial layer on a more heavily doped p-type starting wafer. A first mask (sometimes called Active, Inverse Moat or Field Oxidation) divides the wafer into field oxide regions FOX/STI 806 and active regions (the rest of the wafer excluding 806). Field oxide regions are then formed by etching shallow trench regions FOX/STI 806, growing some thermal oxide, filling the trench with additional oxide or other insulating material, and planarizing the surface of the wafer with a Chemical Mechanical Polish CMP step.

N-type wells NWELL 804 are formed by masked implants. Typically, three or more implants with varying energies using one or more layers of resist to select the areas to be implanted may be used to give the desired depth of penetration, sheet resistance, doping at the STI edge to prevent unwanted inversion, and doping near the surface to help determine transistor threshold voltages. Properties of N-well 804 are selected to be suitable for fabricating p-channel MOSFET devices, and the well 804 is deeper than the STI 806.

P-type wells PWELL 802 are formed by masked implants. Typically three or more implants with varying energies using one or more layers of resist to select the areas to be implanted may be used to give the desired depth or penetration, sheet resistance, doping at the STI edge to prevent unwanted inversion, and doping near the surface to help determine transistor threshold voltages. PWELL 802 properties are selected to be suitable for fabricating n-channel MOSFET devices, and the well is deeper than the STI 806.

An optional feature is a deep n-well DNWELL or buried n-type layer (not shown in FIGS. 8A-8D), deep enough to run under the PWELL 802 and NWELL 804 layers without seriously affecting their characteristics, and connecting to the NWELL 804. A plate of DNWELL and a ring of NWELL are commonly used to isolate a single PWELL 802 or a complete circuit block (e.g., row and column drivers 520 and 530) from the substrate.

Figure 8A:
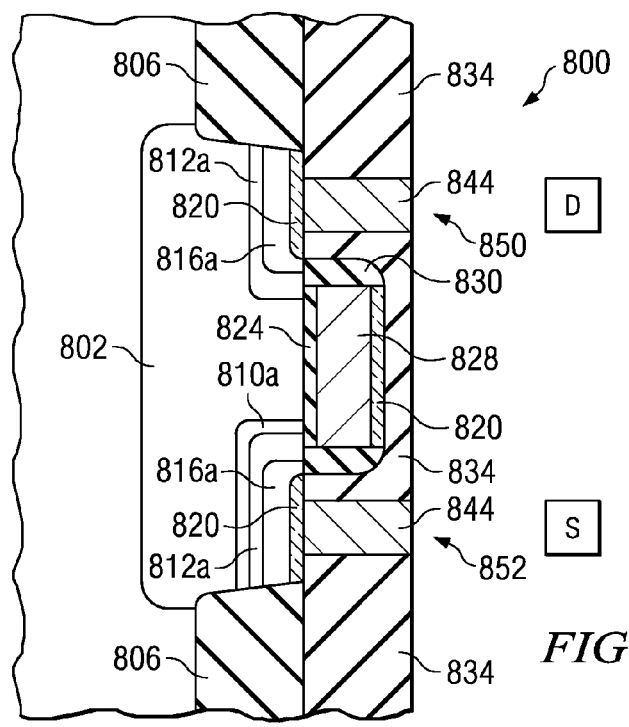
FIGS. 8A-8D are section views and a plan view of an exemplary floating-gate shallow trench isolated (STI) SLP EEPROM memory cell such as may be used in accordance with several aspects of the present invention.
Figure 8B:
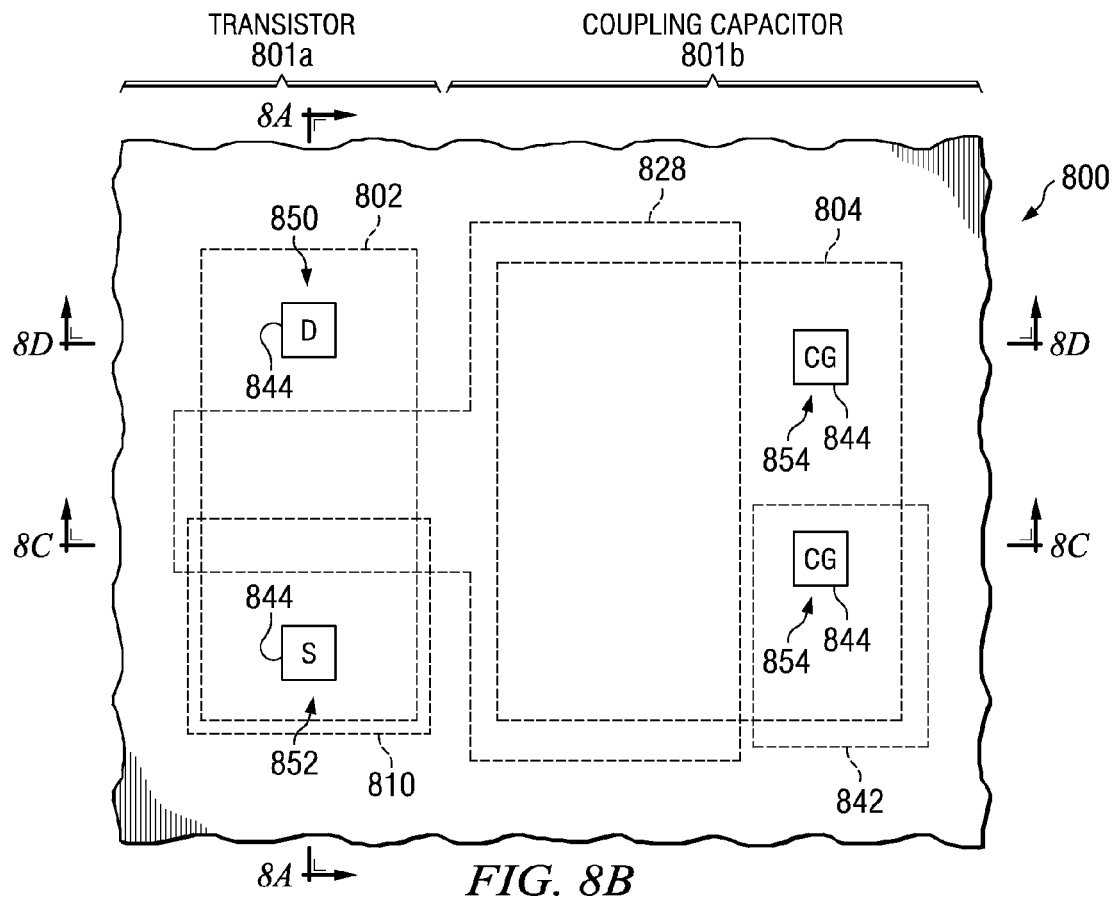
Figure 8C:
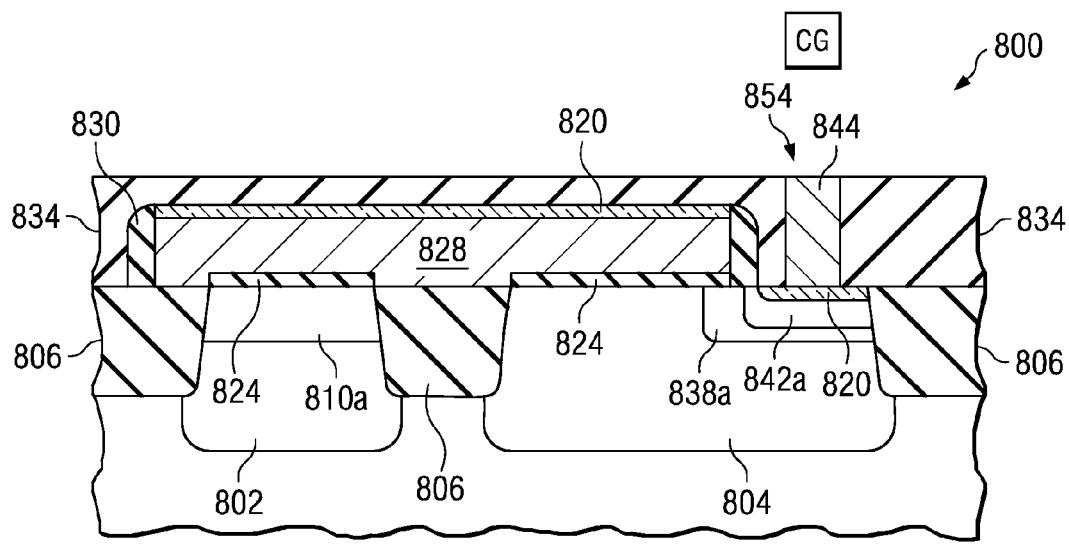
Figure 8D:
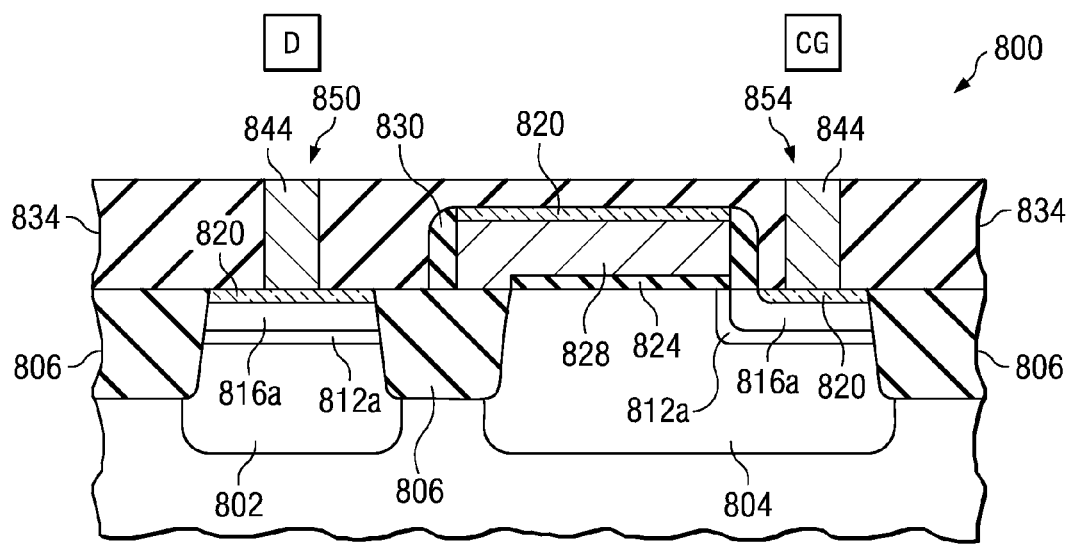

The plan view of FIG. 8B illustrates a mask pattern 810 that is applied to the wafer. The mask pattern 810 together with a drain extension DE implant result in a drain extension region 810a. Pattern 810 and region 810a do not coincide exactly due to the self-aligning features of the implant. The drain extension 810a is a lightly doped source and/or drain region that extends beyond the typical heavily doped source/drain S/D implant regions NLDD 812 and 816. Drain extension 810a is engineered to allow some of the gate to source or gate to drain voltage to appear across depleted silicon and to increase the Vgs or Vgd voltage ratings when building DE transistors. The drain extension DE region 810a may be added solely to increase the breakdown voltage to PWELL 802 in SLP EEPROM arrays, which is smaller than a full DE transistor.

An n-type lightly doped drain NLDD 812a and an NSD n-type source/drain implant NSD 816a form the regular drain implants. The n-type lightly doped drain NLDD 812a and the n-type source/drain NSD 816a implants are self-aligned to the poly 828 and/or poly sidewall spacer 830 (they do not penetrate these features but may add to the poly doping) and are self-aligned to the field oxide (they do not penetrate it and they are not active in it). One or more anneal operations is then accomplished.

As drawn, the transistor 801a forms a high breakdown voltage source-to-back gate (HBVsb) transistor 801a. Note that the order of these implants and the anneal operation or operations used to activate these implants varies between processes. After all field oxidation, well implants and annealing, a gate oxide 824 is then grown over the entire active area of the wafer. Polysilicon 828 is then deposited, and may be selectively doped and patterned to form a transistor gate 828.

After sidewall spacers 830 are formed on all sidewalls of the polysilicon 828, over gate oxide 824 and STI 806, additional implants and anneal operations are used to form the S/D regions including any lightly doped drain regions NLDD 812a, heavy or regular drain regions NSD 816a, p-type lightly doped drain PLDD 838a, p-type source/drain PSD implant region 842a, halo or pocket implants to further control the S/D profiles and possibly to adjust the transistor threshold voltages.

A Salicide 820 process (Self-Aligned Silicide) is then accomplished, wherein the exposed surface of the active silicon and of the poly 828 is converted to a metal silicide 820. Additional process steps (silicide block) are used in some processes to limit the extent of silicide formation.

After silicide 820 formation, a multi-level oxide layer MLO 834 is grown or thermally produced etc. as a collection of insulators to cover the active regions and overlying the silicide 820, FOX/STI 806, and polysilicon 828. The MLO 834 is then planarized by CMP to make an optically flat surface.

Openings are then anisotropically dry etched down through the MLO 834 down to the silicide 820. Conductive contacts 844 (e.g., tungsten) are then formed within the openings in the MLO 834 and again planarized with a CMP to remove all tungsten on top of the MLO 834. In this way, tungsten plug contacts 844 may be fabricated within CMP planarized oxide layer MLL 834 to provide a drain terminal D 850, source terminal S 852, back gate BG (not shown) or bulk node (PWELL 802), and control gate terminals CG 854 in the device.

The wafer construction outlined in the present invention is compatible with conventional and planarized aluminum and copper metal interconnect systems. Many other CMOS processes may also be utilized including additional process steps (multiple thicknesses of gate oxide or multiple layers of poly, for example) that are not required to build SLP EEPROM. Some processes contain additional steps that my be used advantageously to build EEPROM cells including capacitor structures that allow the EEPROM coupling capacitor to be fabricated stacked above the floating gate transistor or otherwise fabricated in a manner that reduces area or avoids p-n isolation junctions in the silicon. Isolating the capacitor from the silicon can reduce the voltage requirements of the EEPROM array and for the row and column driver circuits. Such capacitor examples include:

1. Double layer poly DLP with a suitable dielectric with or without a stack etch option.

2. SLP poly to metal or metallic top plate capacitors with a suitable dielectric, such as a high performance capacitor intended for analog circuit use, which is a standard feature of some processes.

3. Parallel plate and/or lateral flux (interdigitated comb) capacitors using poly and/or metallic interconnect layers to form the capacitor plates.

4. Some processes feature various forms of dielectric isolation. These schemes allow more flexibility in the EEPROM design and can reduce or eliminate the need for transistors rated for operation at VPP.

5. The invention can be built in older or more traditional silicon processes. Single polarity (all NMOS or all PMOS transistors rather than the preferred CMOS) implementations are possible.

Circuit Operation for FIGS. 8A-8D:

In accordance with the half-write method of the present invention, program and erase operations for SLP EEPROM cell 800 are achieved by F-N tunneling between the floating poly gate 828 and the S/D implant 812a through the gate oxide 824. This F-N tunneling is achieved by applying a suitable programming voltage between control gate node CG 854 and node T (node T may be indistinguishable from the source node S 852 or from the drain node D 850). Much of this voltage appears across the tunneling region (depending on the relative size of stray and tunneling region capacitance to the coupling capacitance). Programming voltages and times to store one data bit per element are relatively non-critical. To store multiple data bits or analog signals, tighter control of programming voltages and times may be required.

To program the EEPROM cell 800, and in accordance with one implementation of the invention, the row line coupling capacitor node CG 854 is taken to programming voltage VPP and the column line transistor node S 852 and PWELL 802 are at ground. Under these conditions, the p-n junction between substrate and NWELL 804 must support the VPP voltage. For most CMOS processes, however, this is not a problem.

To erase the EEPROM cell 800, and in accordance with one implementation of the invention, the row line coupling capacitor node CG 854 is taken to ground and the column line transistor node S 852 is at VPP. Under these conditions, the p-n junction between PWELL 802 and transistor node S 852 must support the VPP voltage. This is the reason that the drain extension region 810 is required and that a HBVsb style transistor is used. The voltage across this p-n junction cannot be reduced significantly by allowing the bulk node to rise, because the isolation p-n junction between the coupling capacitor node CG 854 and the bulk node would become forward biased.

Thus, programming with CG 854 positive, and T negative, places electrons on the floating gate FG 828 by F-N tunneling, increases the measured threshold voltage Vt at the control gate CG 854 of an n-channel floating gate transistor (e.g., from 1.7 V with no charge on the floating gate to 4.7 V programmed), and the EEPROM bit is said to be programmed.

Programming with CG 854 negative, and T positive, removes electrons from the floating gate FG 828 by F-N tunneling, decreases the measured threshold voltage Vt at the control gate CG 854 of an n-channel floating gate transistor (e.g., from 1.7 V with no charge on the floating gate to −1.3 V erased), and the EEPROM bit is said to be erased.

In addition ultraviolet light radiation UV can return any EEPROM cell to its virgin or non-programmed state if the design is not opaque to UV. Further, it should be understood that either the programmed or erased state may correspond to writing or storing a logic "1" value in the EEPROM cell form a circuit perspective.

There are several exemplary ways, however, to reduce the voltage across the p-n junction between PWELL 802 and transistor node S 844 to VPP/2 and to allow replacing the HBVsb transistor with a simpler conventional transistor. All these solutions involve finding ways to avoid forward biasing a p-n junction between the coupling capacitor node C NWELL 804 and the bulk node and involve allowing the PWELL 802 node to rise to VPP/2. These choices include:

1. Select a process with dielectric isolation, or
2. Use a stacked capacitor (where the C node C NWELL 804 is not an n-type silicon region), or
3. Use DNWELL and a ring of NWELL to isolate PWELL 802 bulk node of the floating gate transistor from the substrate node. While many EEPROM bits can share one isolation structure, the need to isolate floating gate transistors from the SLP coupling capacitors may make the area of this choice greater than the area using HBVsb floating gate transistors.

It is not necessary in any case (although it is possible) to use a drain extension for the drain node D 850 of the floating gate transistor 801a. Note also that the DNWELL is not able to isolate the regular NWELL 804 used for the coupling capacitor 801b or as a drain extension implant as they would touch.

FIGS. 9A-9D illustrates a preferred layout design implementation for the fabrication of a DECMOS EEPROM memory cell 900 without modification to the existing CMOS process such as may be used in accordance with several aspects of the present invention.

Figure 9A:
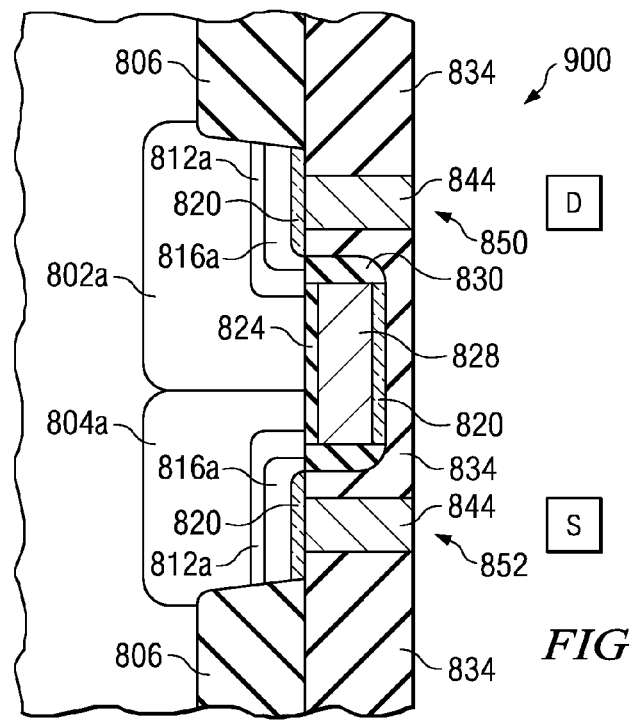
FIGS. 9A-9D are section views and a plan view of a preferred layout design implementation for the fabrication of a DECMOS EEPROM memory cell without modification to the existing CMOS process such as may be used in accordance with several aspects of the present invention.
Figure 9B:
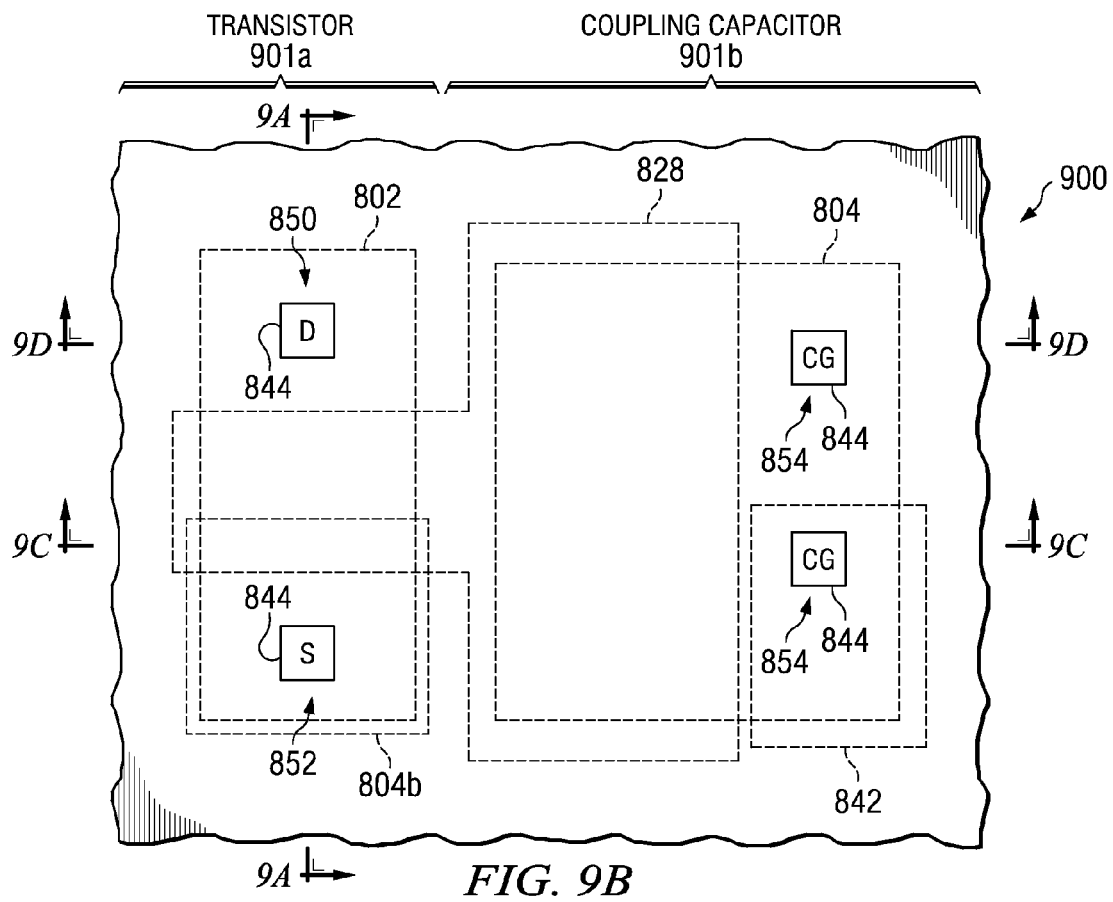
Figure 9C:
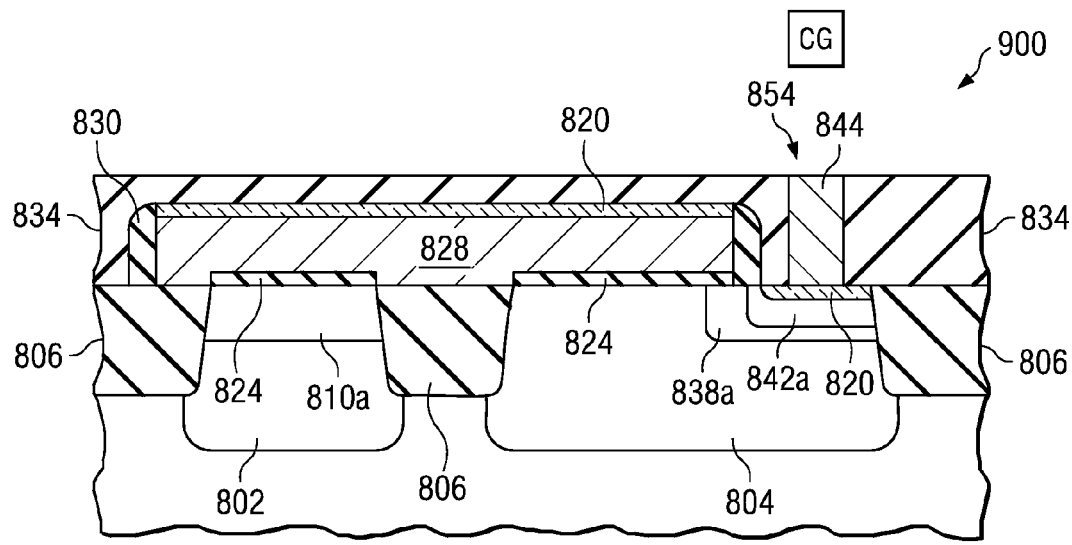
Figure 9D:
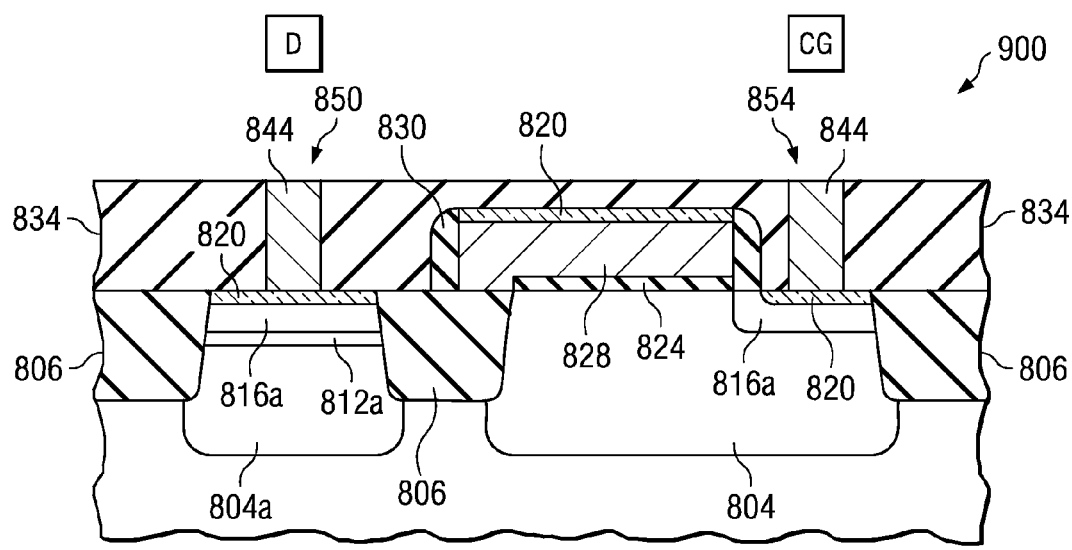

DECMOS EEPROM memory cell 900 is similar in construction to that of the SLP EEPROM memory cell 800 of FIGS. 8A-8D, and as such need not be fully described again for the sake of brevity. DECMOS EEPROM memory cell 900 differs in that the PWELL 802 of FIGS. 8A-8D is divided into a PWELL 802a and NWELL 804a as shown in FIGS. 9A and 9D, provided by NWELL mask 804b as shown in FIG. 9B. The NWELL 804a replaces the DE implant 810a and serves the same purpose. No PWELL is required under NWELL 804a so PWELL 802a in FIG. 9 is smaller than PWELL 802 in FIG. 8. The implementation of FIG. 9 is generally equivalent in operation to that of FIG. 8 and is preferred because no added process steps are required to form the DE region 810a.

EEPROM memory cell 800 and 900 of FIGS. 8 and 9 may be utilized as exemplary cells of an array similar to that of FIGS. 3C and 4A, comprising row and column drivers operable to apply a full-write voltage to the selected memory cell(s) of the array, and to apply a half-write voltage to the remaining unselected cells of the array, in accordance with the half-write method of the present invention.

Figure 10A:
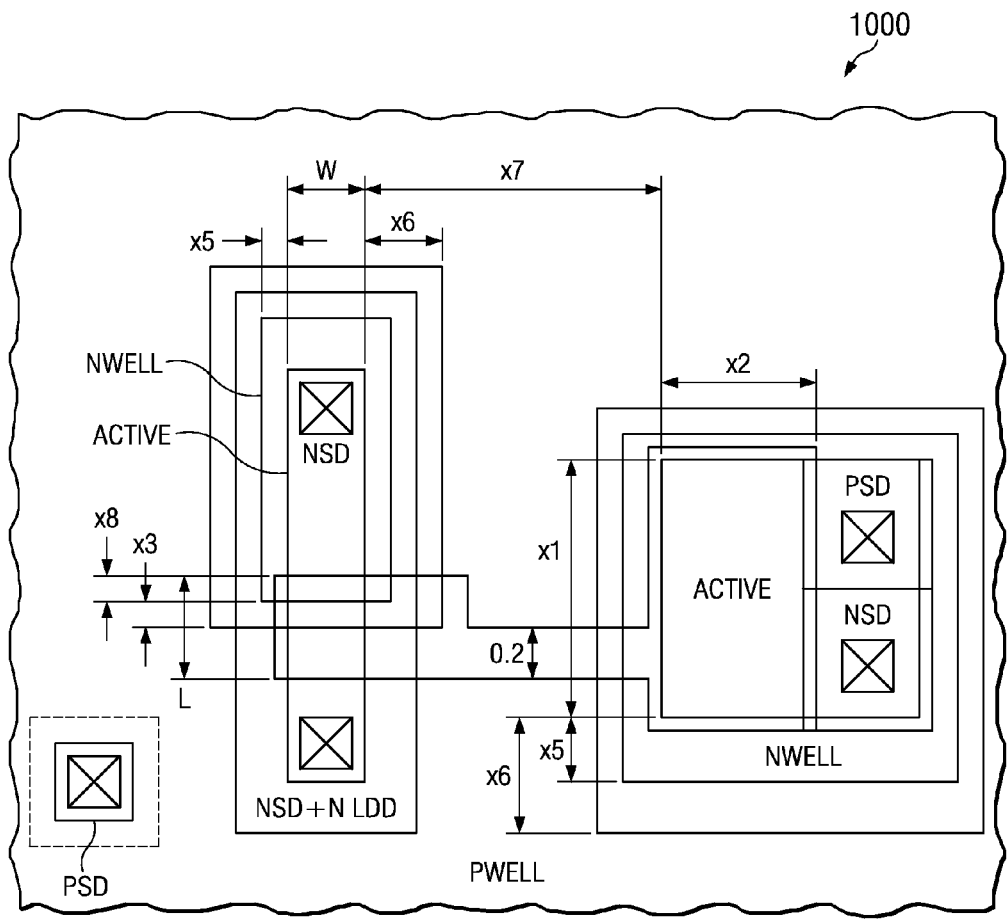
FIGS. 10A and 10B are plan and section views of an exemplary floating-gate SLP EEPROM memory cell such as may be used in accordance with several aspects of the present invention.
Figure 10B:
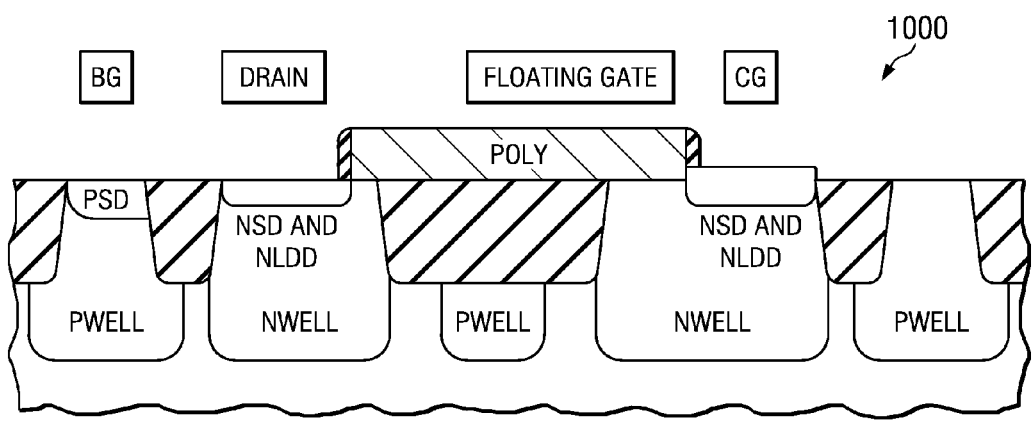

FIGS. 10A and 10B are plan and section views of another exemplary floating-gate SLP EEPROM memory cell 1000 such as may be used in accordance with several aspects of the present invention. SLP EEPROM memory cell 1000 is similar in construction to that of the SLP EEPROM memory cell 800 of FIGS. 8A-8D, and as such need not be fully described again for the sake of brevity.

Although an SLP EEPROM memory cell is illustrated and described in the context of the array 330 of FIG. 3C and 400 of FIG. 4A, it will be appreciated that a mask-programmed ROM or a one-time programmable electrically programmable read only memory OTP EEPROM may also be utilized in accordance with the half-write method of the present invention. In a typical design, using more than one of these memory types, the ROM would be implemented with standard logic or ROM techniques, the OTP EPROM with floating gate p-channel transistors and address and decode circuits similar to the SLP EEPROM, and the SLP EEPROM as described in this disclosure.

True SLP EEPROM uses a coupling capacitor built with gate oxide as the dielectric, silicon under the gate oxide as one plate and poly over the gate oxide dielectric as the other plate. This capacitor is built side by side with the floating gate transistor. The coupling capacitor, the floating gate transistor and the tunneling region (either separate or merged) share the same isolated poly node. In most junction-isolated implementations, the full programming voltage appears between the bottom plate of the coupling capacitor and a source/drain region of the floating gate transistor. This is one of the key factors limiting the area reduction.

Other SLP EEPROM (in contrast to true SLP EEPROM) implementations of this invention use either a double layer poly DLP or another parallel plate capacitor structure, which is a standard feature in a few CMOS processes, to build the coupling capacitor. These process variations allow stacked capacitor SC implementations where the coupling capacitor may be stacked on top of the floating gate transistor (with or without a stacked etch process step), saving die area. Typical stacked capacitor SC EEPROM implementations have a less favorable coupling ratio compared to traditional SLP EEPROM and so require a higher set of voltage levels for writing data (e.g., 16 V to 20 V depending on process parameters and the layout details for a typical 3.3 V process).

SC EEPROM and dielectric isolated SLP EEPROM implementations can avoid the need for floating gate transistors with S/D junctions rated for operation at VPP.

For small SLP EEPROM arrays, one row represents one word of the memory and one column represents one bit in each word.

For larger SLP EEPROM arrays, one row represents multiple words. For writing data, a Y decode scheme may be used to select which columns are to write data and which are to retain data undisturbed. For reading data a Y decode scheme may be used to connect the desired columns to the sense amplifiers.

SLP EEPROM capacitors (using a gate oxide as the dielectric, poly as the top plate or floating gate node, and silicon as the bottom plate) have been built several ways. In the perimeter oriented styles, the gate to source/drain overlap capacitance is exploited. The poly perimeter is maximized by using narrow, long fingers. In this style, adequate capacitance exists between the poly and NSD implants even if the silicon under the poly depletes. Silicon depletion and the resulting reduction in capacitance may be avoided by adding a suitably heavy implant at some process stage prior to gate oxidation. In the preferred area oriented style, the poly is the top plate. The bottom plate is silicon (typically n-well) with both n+ and p+ NSD and PSD contact implants to ensure good contact to the silicon directly under the dielectric regardless of whether it remains n-type or inverts to p-type. This style is widely used in current designs and can provide the necessary capacitance using less die area than the perimeter style.

The SLP EEPROM memory cell and array may also utilize the cross-coupled EEPROM bit 205 of FIGS. 2B and 2C. In this case, two physical EEPROM bits are used to store the true and inverse of the digital data value (this requires no added lines or circuits to write/store data) and typically this is used with a balanced differential sense circuit. With suitable read bias on the control gates CG and with suitable balanced differential read circuits, this scheme provides redundancy in that digital data can be read correctly even if all of the charge stored on one FG node has been lost and most of the charge stored on the other FG node has been lost.

The apparent bit error rate and data retention performance can be improved by the use of the cross coupled EEPROM bit cell or by providing a few additional bits cells per word and using conventional error correction techniques.

In another aspect of the present invention, a method is described for operating an EEPROM array (e.g., 400 of FIG. 4A) of single-level polysilicon memory cells 410 arranged in a plurality of rows 412 and columns 414. The array has a plurality of row control lines 412 for selecting and programming or erasing rows of cells 410, a plurality of column select lines 414 for selecting and programming or erasing columns of cells 410 during program and erase operations of the memory cells 410. The single-level polysilicon memory cells 410 comprising an EEPROM storage cell (e.g., 322 of FIGS. 3A and 3B) comprising a MOS floating-gate transistor 304 connected to a column select line 414, for selecting and programming or erasing a first one of a column of memory cells associated with the column select line 414; a gate capacitor; a coupling capacitor 308 connected to one of the plurality of row control lines 412 for controlling program and erase operations of a selected EEPROM memory cell 410; and a floating gate 310 of the transistor 304 coupled to the gate capacitor and the coupling capacitor 308 at a common node 310 therebetween, the floating gate 310 used for storing a charge representing a data state of the selected memory cell 410.

The array (e.g., 400, 500) further comprises a row driver 520 operable to select a first one of a row 525 of memory cells 410 of the plurality of rows 525 of memory cells 410 using the row selection lines 525; a column driver 530 operable to select a first one of a column 414 of memory cells 410 of the plurality of columns 535 of memory cells 410 using the column selection lines 535; and wherein the row driver 520 and column driver 530 are operable to select one or more memory cells 410 associated with the first row and first column of memory cells 410 using the row selection lines 525 and column selection lines 535, and to apply a programming voltage 540 to the selected memory cells 410 and a half-write voltage to the unselected memory cells 410 of the array (e.g., 400, 500).

The method comprises programming or erasing the selected memory cells 410 of the array (e.g., 400) by applying a programming voltage between the rows 412 and columns 414 associated with the selected memory cells 410 during a program or erase operation, respectively.

The method also comprises stabilizing the remaining unselected memory cells 410 of the array 400 by applying a half-write voltage between the rows 412 and columns 414 associated with the remaining unselected memory cells 410, thereby avoiding disturbing the unselected memory cells 410 during the program or erase operations.

Optionally, the method further comprises reading selected memory cells 410 of the array (e.g., 400, 500) by applying a read voltage to a selected row 412 and columns 414 of the array (e.g., 400, 500) using the row and column drivers 520 and 530, respectively, during a read operation.

Although an nMOS floating-gate SLP EEPROM cell having a tunneling region utilizing the gate to source overlap region has been discussed in accordance with the arrays and method of the present invention, it is appreciated by the inventor that other such cell and transistor technology variations, including pMOS, p-channel or mixed polarity implementations, cells with separate or merged tunneling regions, with dedicated tunnel oxides and/or tunnel implants, cells with a separate tunnel T terminal, and other array, bitline, or wordline orientation variations are anticipated in the context of the present invention.

Further, although the preferred implementation of the invention has been described here in terms of a process that forms a single gate oxide, implementations using multiple gate or tunnel oxide thickness including thermally grown silicon dioxide and/or multiple layers of polysilicon or other such gate materials are also anticipated in the context of the present invention.

The invention is also not limited to the use of silicon wafers, and may be implemented in association with the manufacture of various semiconductor devices, EEPROM memory devices, or other such devices, wherein the design and optimization of an NVM cell, potential data upsets, and wafer area is an issue, where transistor breakdown voltages must be limited, where the unselected cells must be controlled, and wherein the various aspects thereof may be applied.

Memory structures including those comprehended in this invention are optimized by merging or sharing features between multiple memory cells, cell rows and/or cell columns. This has been accomplished in the test structures built and tested to demonstrate this invention. However, for brevity these techniques are not described herein. They should be obvious to anyone skilled in the art of memory and circuit design and layout.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. An array of single-level polysilicon EEPROM memory cells arranged in a plurality of rows and columns, the array comprising:
    row and column driver circuits operable to select one or more rows and columns of memory cells, respectively, to apply a programming voltage comprising first and second half-write voltages associated with the row and column driver circuits, respectively, to the selected memory cells associated with the selected rows and columns, and to apply a stabilizing voltages comprising about half of the programming voltage to the remaining unselected memory cells of the array during a program or erase operation, wherein a maximum voltage between any two rows or any two columns is about half of the programming voltage;
    the EEPROM memory cells comprising:
        a MOS floating-gate transistor having a drain region connected to a column-source select line, for selecting and programming or erasing a first one of a column of selected memory cells;
        a gate capacitor or tunneling region;
        a coupling capacitor connected to a row control line for controlling program and erase operations of a first one of a row of selected memory cells; and
        a floating gate of the transistor coupled to the gate capacitor and the coupling capacitor at a common node therebetween, the floating gate used for storing a charge representing a data state of the memory cell.

2. The array of claim 1, wherein the EEPROM memory cells further comprise:
    a MOS select transistor having a gate lead connected to a row select line for selecting a first one of a row of memory cells to read, a drain connected to a column-drain select line for selecting a first one of a column of memory cells associated with the column-drain select line to read, and a source lead connected to a drain of the MOS floating-gate transistor;
    wherein the MOS select transistor and the MOS floating-gate transistor are series connected between the column-drain select line and the column-source select line.

3. The array of claim 1, wherein the memory cells are further operable to store multiple bits of data or a representation of an analog value.

4. The array of claim 1, wherein drain leads of two or more memory cells of the array of single-level poly EEPROM memory cells are connected to a common node to further enable read and write memory operations.

5. The array of claim 1, wherein the gate capacitor comprises a gate dielectric layer of silicon dioxide having a thickness of about 60 angstroms or greater and about 75 angstroms or less.

6. The array of claim 1, wherein the row and column driver circuits of the array comprise high voltage transistors, and the EEPROM memory cells of the array comprise only low voltage transistors.

7. The array of claim 1, wherein the row and column driver circuits of the array comprise high voltage transistors, and the EEPROM memory cells of the array comprise only low voltage transistors, wherein each memory cell has a single drain extension region.

8. The array of claim 1, wherein the floating gate of the MOS transistor forms one plate of the gate capacitor and the coupling capacitor shared in common.

9. The array of claim 1, wherein the MOS floating-gate transistor of the EEPROM memory cell comprises one of an nMOS transistor and a pMOS transistor.

10. The array of claim 1, wherein the voltage applied to the unselected memory cells is about half of the programming voltage applied to the selected memory cells or less during program and erase operations.

11. The array of claim 1, wherein the stabilizing voltage applied to the unselected memory cells is about half of the programming voltage or less, and the difference between the first and second half-write voltages applied to the selected memory cells is about the programming voltage.

12. The array of claim 11, wherein the stabilizing voltage applied to the unselected memory cells is about 6 volts or less, and the difference between the first and second half-write voltages applied to the selected memory cells comprising the programming voltage is about 12 volts.

13. The array of claim 1, further comprising:
    first and second half-write power supplies operable to provide first and second half-write voltages to the row and column drivers, respectively, wherein the programming voltage is produced across selected memory cells for selecting and programming or erasing the selected memory cells during a program or erase operation, and wherein the half-write voltage level is produced across the unselected memory cells to avoid disturbing the unselected memory cells during the program or erase operations.

14. The array of claim 13, wherein the first half-write voltage is about −6 volts, and the second half-write voltage is about +6 volts.

15. The array of claim 13, wherein the stabilizing voltage applied to the unselected memory cells is about half of the programming voltage or less, and the difference between the first and second half-write voltages applied to the selected memory cells is about the programming voltage.

16. The array of claim 13, wherein the stabilizing voltage applied to the unselected memory cells is about 6 volts or less, and the difference between the first and second half-write voltages applied to the selected memory cells comprising the programming voltage is about 12 volts.

17. The array of claim 1, wherein one or more of the row and column driver circuits is isolated from the substrate to permit operation at a separate supply voltage.

18. The array of claim 1, wherein one of the row and column driver circuits is isolated from the substrate to permit operation at or above the half-write voltage.

19. The array of claim 18, wherein the output transistors of the isolated drivers comprise low voltage transistors rated at about half of the programming voltage.

20. The array of claim 1, wherein the EEPROM memory cell comprises one of a stacked capacitor SC EEPROM and a dielectric isolated SLP EEPROM, wherein no junction in the array sees more than the half-write voltage.

21. The array of claim 20, wherein the transistors of the memory cell comprise low voltage transistors rated at about half of the programming voltage or above.

22. The array of claim 1, wherein the gate capacitor comprises a gate dielectric layer of silicon dioxide having a thickness of about 50 angstroms or greater and less than about 200 angstroms.

23. The array of claim 1, wherein the tunneling region is separate from the floating gate transistor.

24. An array of single-level polysilicon EEPROM memory cells arranged in a plurality of rows and columns, the array comprising:
row and column driver circuits operable to select one or more rows and columns of memory cells, respectively, to apply a programming voltage comprising first and second half-write voltages associated with the row and column driver circuits, respectively, to the selected memory cells associated with the selected rows and columns, and to apply one of the first and second half-write voltages or less to the remaining unselected memory cells of the array during a program or erase operation;
the EEPROM memory cells comprising first and second cross-coupled EEPROM bits, each bit comprising:
a MOS floating-gate transistor having a drain region connected to a column-source select line, for selecting and programming or erasing a first one of a column of selected memory cells;
a gate capacitor;
a coupling capacitor connected to a row control line for controlling program and erase operations of a first one of a row of selected memory cells; and
a floating gate of the transistor coupled to the gate capacitor and the coupling capacitor at a common node therebetween, the floating gate used for storing a charge representing a data state of the memory cell;
wherein a first coupling capacitor of the first bit is connected to a second gate capacitor of the second bit, and a second coupling capacitor of the second bit is connected to a first gate capacitor of the first bit.

25. An EEPROM array of single-level polysilicon memory cells arranged in a plurality of rows and columns, the array also having a plurality of row select lines for selecting a row of the memory cells to read, a plurality column-source select lines for program and erase operations on columns of cells, a plurality of column-drain select lines for reading data from columns of cells, and a plurality of row control lines for controlling programming and erase operations on rows of memory cells, the memory array comprising:
the single-level polysilicon memory cells comprising an nMOS select transistor having a row select gate lead connected to a row select line and a drain connected to a column-drain select line, for selecting a first one of a row of memory cells and a first one of a column of memory cells associated with the column-drain select line; and an EEPROM storage cell comprising a MOS floating-gate transistor having a single drain extension region connected to a column-source select line, for selecting a first one of a column of memory cells associated with the column-source select line; a gate capacitor; a coupling capacitor connected to a row control line for controlling program and erase operations of the EEPROM memory cell; and a floating gate of the transistor forming one plate of the gate capacitor and the coupling capacitor shared in common, wherein the nMOS select transistor and the FE PROM storage cell are series-connected between the column-drain select line and the column-source select line;
a row driver operable to select a first one of a row of memory cells of the plurality of rows of memory cells using the row selection lines;
a column driver operable to select a first one of a column of memory cells of the plurality of columns of memory cells using the column-drain and column-source selection lines; and
wherein the row and column drivers are operable to select one or more rows and columns of memory cells, respectively, to apply a programming voltage to the selected memory cells associated with the selected rows and columns, and to apply one of a first and second half-write voltages comprising about half of the programming voltage to the remaining unselected memory cells of the array during a program or erase operation, wherein a maximum voltage between any two rows or any two columns is about half of the programming voltage.

26. The array of claim 25, wherein at least one of the first and second half-write voltages is about half of the programming voltage or less.

27. The array of claim 25, wherein the one of the first and second half-write voltages applied to the unselected cells is about half of the programming voltage applied to the selected cells or less during program and erase operations.

28. The array of claim 25, wherein the one of the first and second half-write voltages applied to the unselected memory cells is about 6 volts or less, and the difference between the first and second half-write voltages applied to the selected memory cells comprising the programming voltage is about 12 volts.

29. The array of claim 25, further comprising:
first and second half-write power supplies operable to provide the first and second half-write voltages to the row and column drivers, respectively, wherein a programming voltage level is produced across selected memory cells for selecting and programming or erasing the selected memory cells during a program or erase operation, and wherein about half of the programming voltage level or less is produced across the unselected memory cells to avoid disturbing the unselected memory cells during the program or erase operations.

30. The array of claim 29, wherein the half-write voltage applied to the unselected cells is about half of the programming voltage or less applied to the selected cells during program and erase operations.

31. The array of claim 29, wherein the first half-write voltage is about −6 volts, and the second half-write voltage is about +6 volts.

32. The array of claim 29, wherein the half-write voltage applied to the unselected memory cells is about half of the programming voltage or less, and the difference between the first and second half-write voltages applied to the selected memory cells is about the programming voltage.

33. The array of claim 29, wherein the half-write voltage applied to the unselected memory cells is about 6 volts or less, and the difference between the first and second half-write voltages applied to the selected memory cells comprising the programming voltage is about 12 volts.

34. The array of claim 25, wherein each memory cell of the array is further operable to store multiple bits of data.

35. The array of claim 25, wherein one or more of the row and column driver circuits is isolated from the substrate to permit operation at a separate voltage.

36. The array of claim 35, wherein the output transistors of the isolated drivers comprise low voltage transistors rated at about half of the programming voltage.

37. A method of operating an FE PROM array of single-level polysilicon memory cells arranged in a plurality of rows and columns, the array having a plurality of row control lines for selecting and programming or erasing rows of cells, a plurality of column select lines for selecting and programming or erasing columns of cells during program and erase operations of the memory cells, the single-level polysilicon memory cells comprising an EEPROM storage cell comprising a MOS floating-gate transistor connected to a column select line, for selecting and programming or erasing a first one of a column of memory cells associated with the column select line; a gate capacitor; a coupling capacitor connected to one of the plurality of row control lines for controlling program and erase operations of a selected EEPROM memory cell; and a floating gate of the transistor coupled to the gate capacitor and the coupling capacitor at a common node therebetween, the floating gate used for storing a charge representing a data state of the selected memory cell, the array further comprising a row driver operable to select a first one of a row of memory cells of the plurality of rows of memory cells using the row selection lines; a column driver operable to select a first one of a column of memory cells of the plurality of columns of memory cells using the column selection lines; and wherein the row and column drivers are operable to select one or more memory cells associated with the first row and first column of memory cells using the row and column selection lines, and to apply a programming voltage to the selected memory cells and a half-write voltage to the unselected memory cells of the array, the method comprising:

programming or erasing the selected memory cells of the array by applying a programming voltage between the rows and columns associated with the selected memory cells during a program or erase operation, respectively; and stabilizing the remaining unselected memory cells of the array by applying a stabilizing voltage comprising about half of the programming voltage or less between the rows and columns associated with the remaining unselected memory cells, wherein a maximum voltage between any two rows or any two columns is about half of the programming voltage, thereby avoiding disturbing the unselected memory cells during the program or erase operations.

38. The method of claim 37, wherein the programming or erasing the selected memory cells of the array by applying a programming voltage between the rows and columns associated with the selected memory cells during a program or erase operation, respectively, comprises:

programming the selected memory cells of the array by applying a first polarity programming voltage between the rows and columns associated with the selected memory cells during a program operation; and erasing the selected memory cells of the array by applying a second polarity programming voltage between the rows and columns associated with the selected memory cells during an erase operation.

39. The method of claim 37, wherein the stabilizing voltage applied to the unselected cells is about half of the programming voltage applied to the selected cells during program and erase operations.

40. The method of claim 37, further comprising reading selected memory cells of the array by applying a read voltage to a selected row and columns of the array using the row and column drivers during a read operation.

41. A method of operating an EEPROM array of single-level polysilicon memory cells arranged in a plurality of rows and columns, the array having a plurality of row select lines for accessing rows of cells, a plurality of column-drain select lines and column-source select lines for accessing columns of cells, and a plurality of row control lines for controlling programming and erase operations of the memory cells, the single-level polysilicon memory cells comprising an nMOS select transistor having a row select gate lead connected to a row select line and a drain connected to a column-drain select line, for selecting a first one of a row of memory cells and a first one of a column of memory cells associated with the column-drain select line; and an EEPROM storage cell comprising an nMOS floating-gate transistor having a single drain extension region connected to a column-source select line, for selecting a first one of a column of memory cells associated with the column-source select line; a gate capacitor; a coupling capacitor connected to a row control line for controlling program and erase operations of the EEPROM memory cell; and a floating gate of the transistor forming one plate of the gate capacitor and the coupling capacitor shared in common, wherein the nMOS select transistor and the EEPROM storage cell are series-connected between the column-drain select line and the column-source select line; the array further comprising a row driver operable to select a first one of a row of memory cells of the plurality of rows of memory cells using the row selection lines; a column driver operable to select a first one of a column of memory cells of the plurality of columns of memory cells using the column-drain and column-source selection lines; and wherein the row and column drivers are operable to select a memory cell associated with the first row and first column of memory cells using the row, column-drain, and column-source selection lines, and to program or erase the selected memory cell, the method comprising:

programming or erasing the selected memory cells of the array by applying a programming voltage between the rows and columns associated with the selected memory cells during a program or erase operation, respectively; and stabilizing the remaining unselected memory cells of the array by applying a stabilizing voltage comprising about half of the programming voltage between the rows and columns associated with the remaining unselected memory cells, wherein a maximum voltage between any two rows or any two columns is about half of the programming voltage, thereby avoiding disturbing the unselected memory cells during the program or erase operations.

42. The method of claim 41, further comprising reading selected memory cells of the array by applying a read voltage to a selected row and columns of the array using the row and column drivers during a read operation.

43. The method of claim 41, wherein the stabilizing voltage applied to the unselected cells is about half of the programming voltage or less applied to the selected cells during program and erase operations.

* * * * *